(12) United States Patent
Takahashi et al.

(10) Patent No.: US 10,199,002 B2
(45) Date of Patent: Feb. 5, 2019

(54) ELECTROOPTICAL DEVICE, ELECTRONIC APPARATUS, AND METHOD FOR DRIVING ELECTROOPTICAL DEVICE

(71) Applicant: SEIKO EPSON CORPORATION, Tokyo (JP)

(72) Inventors: Nariya Takahashi, Chino (JP); Hiroyuki Hosaka, Matsumoto (JP); Suguru Uchiyama, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/641,006

(22) Filed: Jul. 3, 2017

(65) Prior Publication Data

US 2018/0033387 A1     Feb. 1, 2018

(30) Foreign Application Priority Data

Jul. 26, 2016    (JP) ................................ 2016-146170

(51) Int. Cl.
*G09G 3/36* (2006.01)
*G02F 1/1362* (2006.01)
*G02F 1/1333* (2006.01)
*H01L 27/12* (2006.01)
*G02F 1/1345* (2006.01)

(52) U.S. Cl.
CPC ..... *G09G 3/3648* (2013.01); *G02F 1/136286* (2013.01); *G09G 3/3688* (2013.01); *G02F 1/13452* (2013.01); *G02F 1/133305* (2013.01); *G09G 2300/0426* (2013.01); *G09G 2310/0202* (2013.01); *G09G 2310/0259* (2013.01); *G09G 2310/0297* (2013.01); *G09G 2320/0204* (2013.01); *G09G 2320/0233* (2013.01); *H01L 27/124* (2013.01)

(58) Field of Classification Search
CPC ......................... G09G 3/3688; G09G 3/3685
See application file for complete search history.

(56) References Cited

U.S. PATENT DOCUMENTS

| | | | | |
|---|---|---|---|---|
| 2008/0309599 | A1* | 12/2008 | Tsuda | G09G 3/3688 345/88 |
| 2009/0179835 | A1* | 7/2009 | Ito | G09G 3/3688 345/76 |
| 2009/0267877 | A1* | 10/2009 | Yen | G09G 3/006 345/87 |
| 2010/0053129 | A1* | 3/2010 | Morita | G09G 3/2011 345/205 |

FOREIGN PATENT DOCUMENTS

| | | |
|---|---|---|
| JP | 2004-252331 A | 9/2004 |
| JP | 2005-072145 A | 3/2005 |
| JP | 2007-212956 A | 8/2007 |
| JP | 2015-232590 A | 12/2015 |

* cited by examiner

*Primary Examiner* — Christopher J Kohlman
(74) *Attorney, Agent, or Firm* — Oliff PLC

(57) ABSTRACT

A first supply circuit outputs data signals to odd-numbered distribution circuits, and outputs selection signals to all of distribution circuits. A second supply circuit outputs data signals to even-numbered distribution circuits. The odd-numbered distribution circuits distribute the data signals to signal lines using the selection signals. The even-numbered distribution circuits distribute the data signals to signal lines using the selection signals. The first supply circuit outputs the data signals generated based on digital data signals which are basic signals of the data signals and an adjustment value, to the distribution circuits.

19 Claims, 11 Drawing Sheets

ELECTROOPTICAL DEVICE, ELECTRONIC APPARATUS, AND METHOD FOR DRIVING ELECTROOPTICAL DEVICE

BACKGROUND

1. Technical Field

The present invention relates to an electrooptical device and an electronic apparatus.

2. Related Art

In a high-definition electrooptical device (for example, a liquid crystal display device), in a case where only a single driving circuit outputs data signals, a large load is applied to the single driving circuit. As a method of reducing the load, a method of outputting data signals using a plurality of (two) driving circuits is known (refer to JP-A-2007-212956).

Meanwhile, there is a case where the electrooptical device includes distribution circuits such as demultiplexers that distribute the data signals output from the driving circuits to a plurality of signal lines according to selection signals. Here, each of the driving circuits can output the selection signals for the distribution circuits in addition to the data signals. In this case, a case that controls the distribution circuits using only the selection signals output from any one of the plurality of driving circuits, is considered.

However, in this case, there is a difference in an operating condition in which the driving circuits supply or do not supply the selection signals to the distribution circuits. In the driving circuit that does not supply the selection signals to the distribution circuits, the power supply voltage does not vary due to the output of the selection signals. However, in the driving circuit that supplies the selection signals to the distribution circuits, the power supply voltage varies (for example, varies to a lower voltage side) due to the output of the selection signals (for example, the falling of the selection signals). The difference in variations of the power supply voltage causes variations in the data signals between the driving circuits, and this may cause deterioration in image quality.

SUMMARY

An advantage of some aspects of the invention is to perform display with high definition and high quality by preventing deterioration in image quality due to variations in data signals.

An electrooptical device according to an aspect of the invention includes: a plurality of first pixels that are disposed corresponding to the respective intersections between a plurality of first signal lines which belong to a first signal line group and a plurality of scanning lines, and that display gradation according to first data signals supplied to the first signal lines when the scanning lines are selected; a plurality of second pixels that are disposed corresponding to the respective intersections between a plurality of second signal lines which belong to a second signal line group and the plurality of scanning lines, and that display gradation according to second data signals supplied to the second signal lines when the scanning lines are selected; a first distribution unit that distributes the first data signals to the first signal lines using first selection signals; a second distribution unit that distributes the second data signals to the second signal lines using the first selection signals; a first supply unit that supplies the first data signals and the first selection signals; and a second supply unit that supplies the second data signals, in which the first data signals or the second data signals are adjusted based on an adjustment value for adjusting display of the first pixels or the second pixels.

Since the first distribution unit and the second distribution unit distribute the data signals using the first selection signals output from the first supply unit, the first supply unit has a larger load than that of the second supply unit, and a variation in the power supply voltage increases. Therefore, the degree of the variation in the first data signals output from the first supply unit is greater than that of the second data signals output from the second supply unit. However, in this aspect, it is possible to adjust (compensate) the variation in the first data signals or the second data signals due to the variation in the power supply voltage by using the adjustment value, and it is possible to reduce a variation in the luminance or the like between the first pixels to which the first data signals are supplied and the second pixels to which the second data signals are supplied.

An electrooptical device according to another aspect of the invention includes: a plurality of scanning lines; a plurality of first signal lines; a plurality of second signal lines; a plurality of first pixels that are disposed corresponding to the respective intersections between the plurality of scanning lines and the plurality of first signal lines, and that perform display according to first data signals supplied to the first signal lines when the scanning lines are selected; a plurality of second pixels that are disposed corresponding to the respective intersections between the plurality of scanning lines and the plurality of second signal lines, and that perform display according to second data signals supplied to the second signal lines when the scanning lines are selected; a scanning line driving unit that sequentially selects each of the plurality of scanning lines; a first supply unit that outputs the first data signals and selection signals for controlling distribution of the first data signals to the plurality of first signal lines and distribution of the second data signals to the plurality of second signal lines; a second supply unit that outputs the selection signals and the second data signals; a first distribution unit that distributes the first data signals to the plurality of first signal lines using the selection signals output from the first supply unit; and a second distribution unit that distributes the second data signals to the plurality of second signal lines using the selection signals output from the first supply unit, in which the first supply unit outputs, as the first data signals, signals generated based on basic signals of the first data signals and an adjustment value for adjusting the display of the plurality of first pixels, to the first distribution unit.

Since the first distribution unit and the second distribution unit distribute the data signals using the selection signals output from the first supply unit, the first supply unit has a larger load than that of the second supply unit, and a variation in the power supply voltage increases. Therefore, the degree of the variation in the data signals output from the first supply unit is greater than that of the data signals output from the second supply unit. However, in this aspect, it is possible to adjust (compensate) the variation in the first data signals supplied from the first supply unit due to the variation in the power supply voltage by using the adjustment value, and it is possible to reduce a variation between the first data signals and the second data signals supplied from the second supply unit. Therefore, it is possible to prevent deterioration in image quality.

Preferably, the electrooptical device further includes a first signal generation unit that generates the first data signals based on the basic signals of the first data signals and the adjustment value, and the first supply unit outputs the first data signals generated by the first signal generation unit to the first distribution unit.

According to this aspect, it is possible to generate the first data signals based on the basic signals of the first data signals and the adjustment value.

In the electrooptical device, preferably, the first signal generation unit is incorporated in the first supply unit.

According to this aspect, the first data signals can be generated in the first supply unit based on the basic signals of the first data signals and the adjustment value.

Preferably, the electrooptical device further includes a second signal generation unit that generates third data signals based on the basic signals of the first data signals and the adjustment value. Preferably, the first supply unit generates the first data signals based on the third data signals generated by the second signal generation unit, and outputs the first data signals to the first distribution unit.

According to this aspect, the first supply unit can generate the first data signals based on the third data signals generated based on the basic signals of the first data signals and the adjustment value.

In the electrooptical device, preferably, the adjustment value is an adjustment value for adjusting the luminance of the plurality of first pixels to be high.

According to this aspect, it is possible to prevent decrease of the luminance of the plurality of first pixels due to the variation in the first data signals by using the adjustment value.

In the electrooptical device, preferably, the first distribution unit and the second distribution unit are disposed adjacent to each other.

According to this aspect, the first distribution unit and the second distribution unit can be disposed close to each other.

In the electrooptical device, preferably, the plurality of scanning lines, the plurality of first signal lines, the plurality of second signal lines, the plurality of first pixels, the plurality of second pixels, the scanning line driving unit, the first distribution unit, and the second distribution unit are provided in an electrooptical panel. Preferably, the electrooptical panel includes a first input unit that receives the first data signals and the selection signals from the first supply unit and a second input unit that receives the second data signals from the second supply unit. Preferably, the first distribution unit receives the first data signals and the selection signals via the first input unit, the second distribution unit receives the selection signals via the first input unit and receives the second data signals via the second input unit, and the first input unit and the second input unit are disposed side by side in the length direction of the first signal lines.

According to this aspect, compared to a case where the arrangement direction of the first input unit and the second input unit matches with the specific direction orthogonal to the length direction of the first signal lines, it is possible to shorten the length in the specific direction of the region where the first input unit and the second input unit are disposed.

In the electrooptical device, preferably, the second supply unit stops the output of the selection signals.

According to this aspect, since the second supply unit stops the output of the selection signals which are not used for both of the first distribution unit and the second distribution unit, it is possible to achieve low power consumption.

An electronic apparatus according to still another aspect of the invention includes the above-described electrooptical device. The electrooptical device can prevent deterioration in image quality.

A method for driving an electrooptical device according to still another aspect of the invention includes: supplying first data signals and first selection signals by a first supply unit; supplying second data signals by a second supply unit; distributing the first data signals to first signal lines using the first selection signals, by a first distribution unit; distributing the second data signals to second signal lines using the first selection signals, by a second distribution unit; displaying gradation according to first data signals supplied to the first signal lines when the scanning lines are selected, by first pixels that are disposed corresponding to the respective intersections between the first signal lines and scanning lines; displaying gradation according to the second data signals supplied to the second signal lines when the scanning lines are selected, by second pixels that are disposed corresponding to the respective intersections between the second signal lines and the scanning lines; and adjusting the first data signals or the second data signals based on an adjustment value for adjusting display of the first pixels or the second pixels.

Since the first distribution unit and the second distribution unit distribute the data signals using the first selection signals output from the first supply unit, the first supply unit has a larger load than that of the second supply unit, and a variation in the power supply voltage increases. Therefore, the degree of the variation in the first data signals output from the first supply unit is greater than that of the second data signals output from the second supply unit. However, in this aspect, it is possible to adjust (compensate) the variation in the first data signals or the second data signals due to the variation in the power supply voltage by using the adjustment value, and it is possible to reduce a variation in the luminance or the like between the first pixels to which the first data signals are supplied and the second pixels to which the second data signals are supplied.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
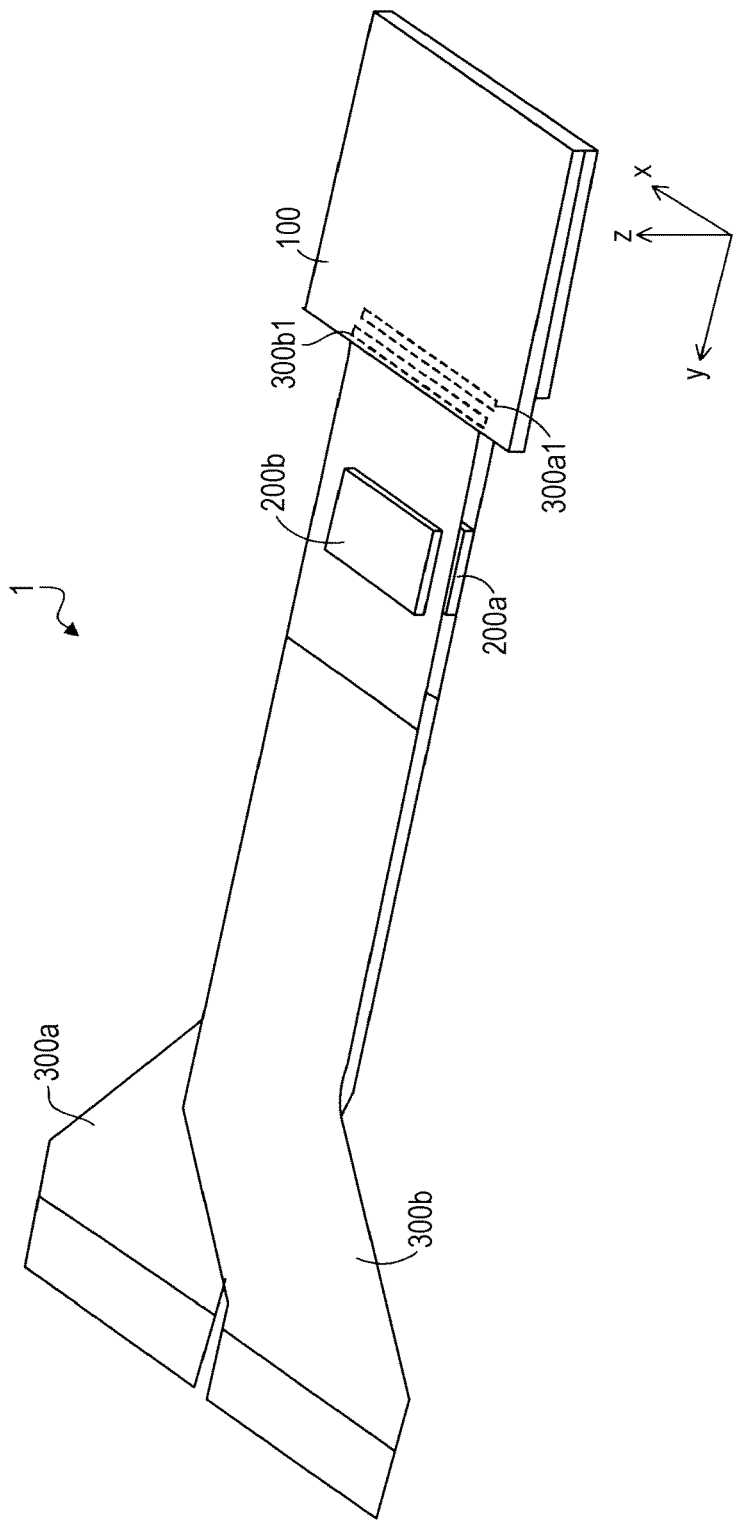
FIG. 1 is a perspective view of an electrooptical device according to a first embodiment of the invention.

Hereinafter, embodiments according to the invention will be described with reference to the drawings. In the drawings, the dimension and the scale of each unit are appropriately different from actual ones. In addition, since the embodiments to be described below are preferable specific examples of the invention, various technically preferable limitations are given. However, unless otherwise stated to limit the invention in the following description, the scope of the invention is not particularly limited to these forms.

First Embodiment

FIG. 1 is a diagram illustrating a configuration of a signal transmission system of an electrooptical device 1 according to an embodiment of the invention. The electrooptical device 1 includes an electrooptical panel 100, a first supply circuit 200a, a second supply circuit 200b, a flexible printed circuit board 300a as a first wiring board, and a flexible printed circuit board 300b as a second wiring board. The electrooptical device 1 may be, for example, a device which has the number of pixels of 3840×2160 obtained by respectively doubling the number of pixels of full hi-vision in the vertical direction and the horizontal direction. Each of the first supply circuit 200a and the second supply circuit 200b is, for example, a driving integrated circuit.

Figure 2:
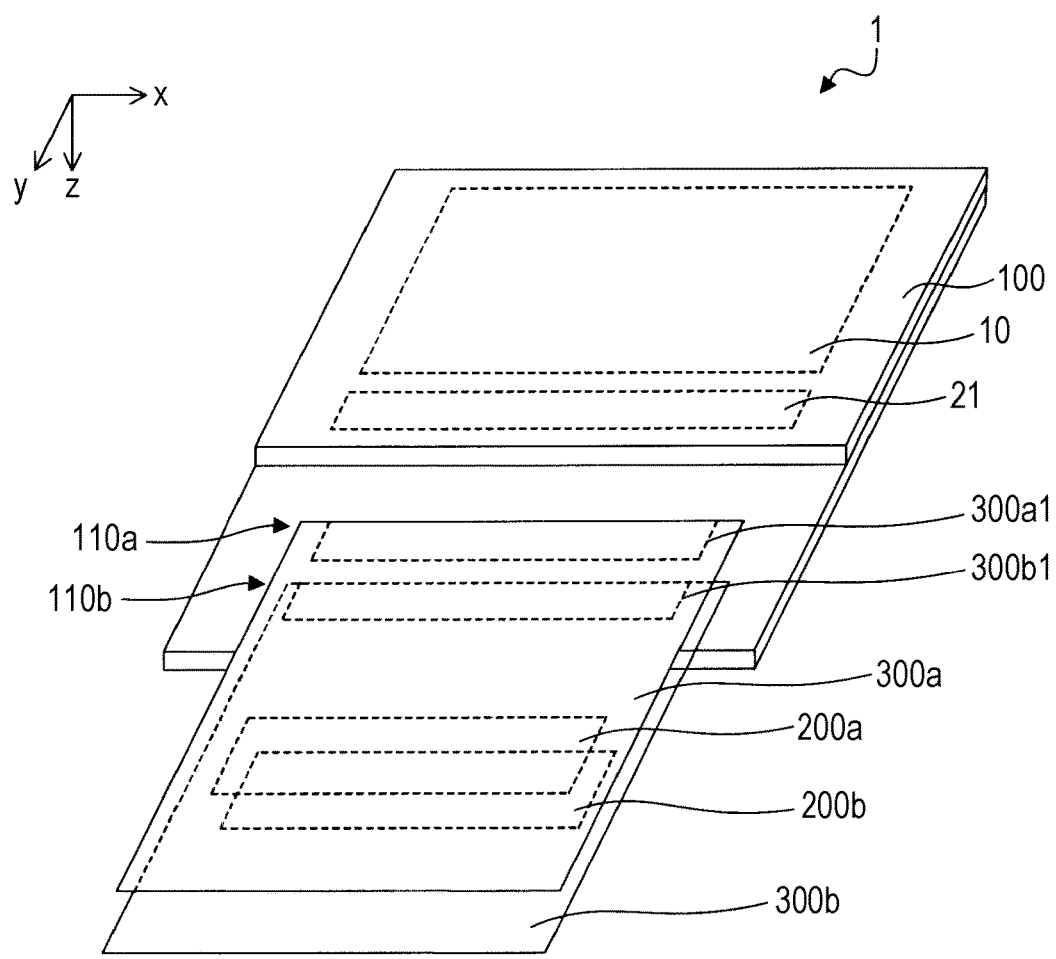
FIG. 2 is a perspective view of the opposite surface of the electrooptical device.

FIG. 2 is a perspective view illustrating a configuration example of the electrooptical device 1 according to a first embodiment in which the invention is adopted. FIG. 2 is a perspective view of the opposite surface of a main portion of FIG. 1.

Outline of Electrooptical Device 1

The electrooptical device 1 has a configuration in which the flexible printed circuit boards 300a and 300b are connected to one side of the electrooptical panel 100.

The first supply circuit 200a is mounted on the flexible printed circuit board 300a by a chip on film (COF) technology. The second supply circuit 200b is mounted on the flexible printed circuit board 300b by the COF technology. The flexible printed circuit board 300a is stacked on the flexible printed circuit board 300b. The first supply circuit 200a is stacked on the second supply circuit 200b. As described above, in this embodiment, the flexible printed circuit board 300a and the flexible printed circuit board 300b are attached to the electrooptical panel 100 such that a part of the flexible printed circuit board 300a and a part of the flexible printed circuit board 300b overlap in a direction (z direction) perpendicular to the display surface of the electrooptical panel 100.

The electrooptical panel 100 includes a first input unit 110a and a second input unit 110b.

The first input unit 110a is an input terminal group. The first input unit 110a receives, for example, various signals output from the first supply circuit 200a via the flexible printed circuit board 300a. The second input unit 110b is an input terminal group. The second input unit 110b receives, for example, various signals output from the second supply circuit 200b via the flexible printed circuit board 300b. The electrooptical panel 100 is driven based on various signals received by the first input unit 110a and various signals received by the second input unit 110b.

Wiring (not illustrated in FIGS. 1 and 2) for transmitting signals is provided on the flexible printed circuit boards 300a and 300b.

One end portion (a connection terminal 300a1) of the wiring of the flexible printed circuit board 300a is connected to the first input unit 110a of the electrooptical panel 100. The other end portion of the wiring of the flexible printed circuit board 300a is connected to a control board 600 (refer to FIG. 9) provided with a control circuit 500 (refer to FIG. 3). The first supply circuit 200a is electrically connected to the electrooptical panel 100 and the control circuit 500 via the wiring of the flexible printed circuit board 300a.

One end portion (a connection terminal 300b1) of the wiring of the flexible printed circuit board 300b is connected to the second input unit 110b of the electrooptical panel 100. The other end portion of the wiring of the flexible printed circuit board 300b is connected to the control board 600. The second supply circuit 200b is electrically connected to the electrooptical panel 100 and the control circuit 500 via the wiring of the flexible printed circuit board 300b.

The first supply circuit 200a receives digital data signals $D-V_{ID}$ and various signals for driving control, from the control circuit 500. The digital data signals $D-V_{ID}$ are digital signals that designate, in a time-division manner, gradation of pixels $P_{IX}$ (refer to FIG. 3) in the electrooptical panel 100. The first supply circuit 200a drives the electrooptical panel 100 based on the signal received from the control circuit 500.

The second supply circuit 200b receives digital data signals $D-V_{ID}$ and various signals for driving control, from the control circuit 500. The second supply circuit 200b drives the electrooptical panel 100 based on the signal received from the control circuit 500.

Details of Electrooptical Device 1

Figure 3:
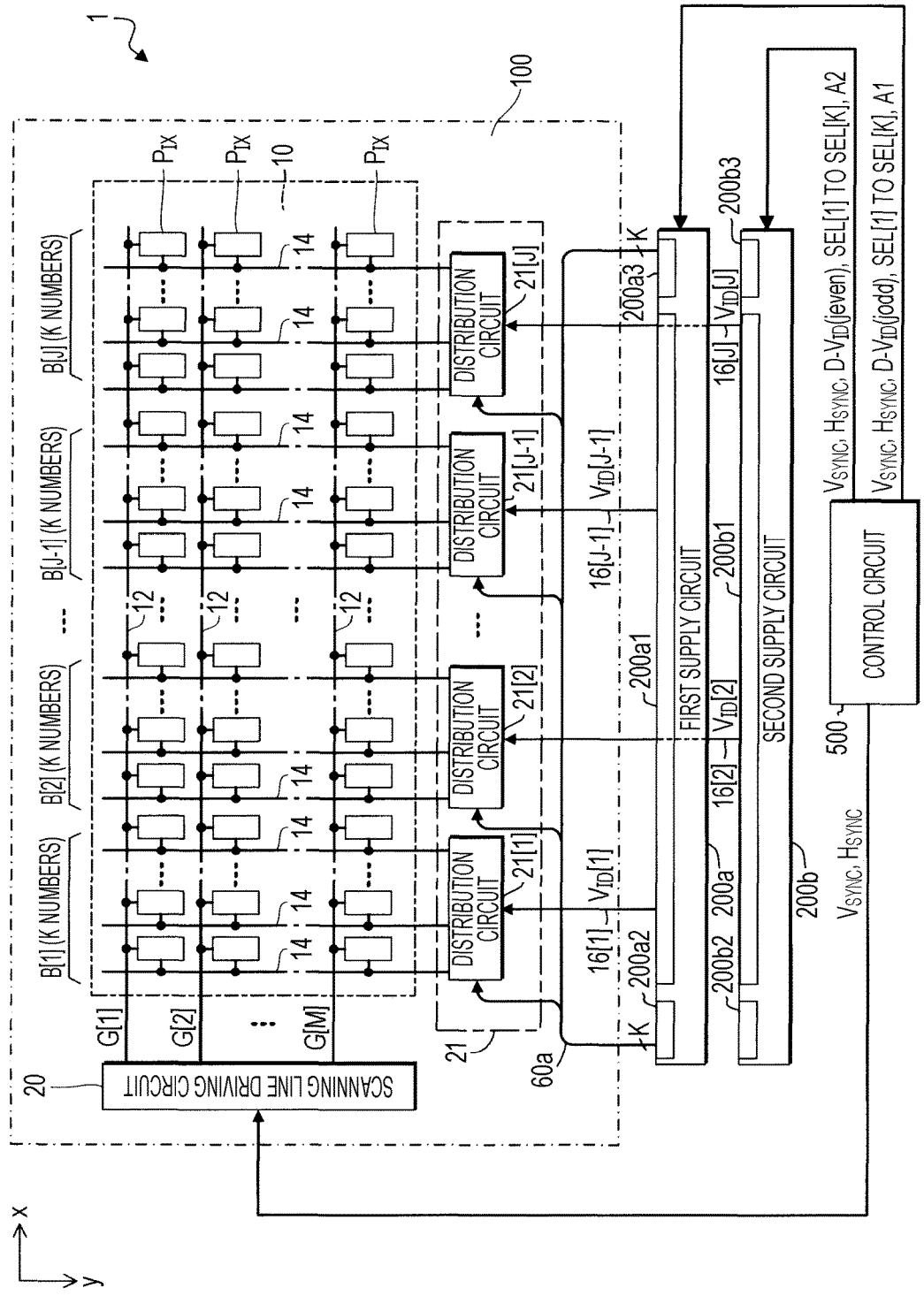
FIG. 3 is a diagram illustrating the electrooptical device.

FIG. 3 is a diagram schematically illustrating a configuration of the electrooptical device 1.

The electrooptical device 1 is controlled by the control circuit 500.

The electrooptical panel 100 includes a pixel unit 10 in which a plurality of pixels $P_{IX}$ are arranged in a matrix shape, a scanning line driving circuit 20, and a distribution circuit group 21.

Pixel Unit 10

In the pixel unit 10, M (M is a natural number of two or more) scanning lines 12 which extend from the scanning line driving circuit 20 along the row direction (x direction), and N (N is 2K, K is a natural number of two or more) signal lines 14 which extend from the distribution circuit group 21 along the column direction (y direction) are formed. The M scanning lines 12 are an example of a plurality of scanning lines. The M scanning lines 12 and the N signal lines 14 cross each other with an insulating layer interposed therebetween.

The plurality of pixels $P_{IX}$ are provided corresponding to respective intersections between the respective scanning lines 12 and the respective signal lines 14. Therefore, the plurality of pixels $P_{IX}$ are arranged in a matrix shape of M rows in the longitudinal direction×N columns in the transverse direction. Each pixel $P_{IX}$ displays the gradation corresponding to the potential of the signal line 14 when the scanning line 12 is selected.

Although the entire area of the pixel unit 10 may be used as a display effective area, a part of the peripheral portion of the pixel unit 10 may be used as a non-display area, and the scanning lines 12, the signal lines 14, and the pixels $P_{IX}$ in the peripheral portion may be arranged as dummy scanning lines, dummy signal lines, and dummy pixels.

Figure 4:
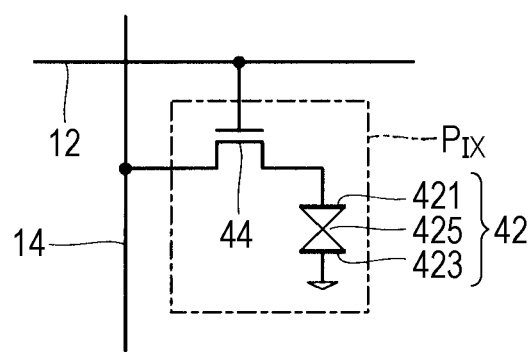
FIG. 4 is a circuit diagram of a pixel.

FIG. 4 is a circuit diagram of the pixel $P_{IX}$. Each pixel $P_{IX}$ is configured to include a liquid crystal element 42 and a selection switch 44.

The liquid crystal element 42 is an example of an electrooptical element. The liquid crystal element 42 is configured to include a pixel electrode 421 and a common electrode 423 that are opposed to each other and a liquid crystal 425 interposed between the pixel electrode 421 and the common electrode 423. The transmittance of the liquid crystal 425 changes according to the voltage applied between the pixel electrode 421 and the common electrode 423. In the following description, for convenience, the voltage applied to the liquid crystal element 42 in a case where the potential of the pixel electrode 421 is higher than that of the common electrode 423 is referred to as a "positive voltage", and the voltage applied to the liquid crystal element 42 in a case where the potential of the pixel electrode 421 is lower than that of the common electrode 423 is referred to as a "negative voltage".

The selection switch 44 is configured with, for example, an N-channel type thin film transistor of which the gate is connected to the scanning line 12. The selection switch 44 is interposed between the liquid crystal element (pixel electrode 421) and the signal line 14, and controls the electrical connection (conduction/non-conduction) between the liquid crystal element 42 and the signal line 14. The pixel $P_{IX}$ (liquid crystal element 42) displays the gradation according to the potential of the signal line 14 when the selection switch 44 is controlled to be in a turned-on state. Auxiliary capacitors and the like connected in parallel to the liquid crystal element 42 are not illustrated. The configuration of the pixel $P_{IX}$ can be appropriately changed.

Returning to FIG. 3, the N signal lines 14 are divided into J wiring groups (blocks) B[j] (j is a natural number of 1≤j≤J, J=N/K) each with K signal lines 14 as a unit. That is, the signal lines 14 are grouped for each wiring group block B. The J wiring groups B[1] to B[J] correspond to J data lines 16[1] to 16[J] in a one-to-one correspondence. Data signals $V_{ID}[1]$ to $V_{ID}[J]$ are supplied to the data lines 16[1] to 16[J], respectively. In this embodiment, since J is an even number of two or more and K signal lines 14 of one unit are adjacent to each other (continuously disposed), the odd-numbered wiring groups B[jodd] and the even-numbered wiring groups B[jeven] are alternately disposed. The data signals $V_{ID}[1]$ to $V_{ID}[J]$ include data signals $V_{ID}[jodd]$ and data signals $V_{ID}[jeven]$.

The signal lines 14 which belong to the odd-numbered wiring groups B[jodd] among the J wiring groups B[1] to B[J] are an example of a plurality of first signal lines. The wiring groups B[jodd] include odd-numbered wiring groups B[1], B[3], . . . , and B[J-1]. Here, "jodd" means "1, 3, . . . , and J-1".

The first supply circuit 200a outputs the data signals $V_{ID}[jodd]$ including, in a time-division manner, the potential supplied to the K signal lines 14 which belong to the wiring groups B[jodd], to the data lines 16[jodd] corresponding to the wiring groups B[jodd] via the first input unit 110a.

The signal lines 14 which belong to the even-numbered wiring groups B[jeven] among the J wiring groups B[1] to B[J] are an example of a plurality of second signal lines. The wiring groups B[jeven] include even-numbered wiring groups B[2], B[4], . . . , and B[J]. Here, "jeven" means "2, 4, . . . , and J".

The second supply circuit 200b outputs the data signals $V_{ID}[jeven]$ including, in a time-division manner, the potential supplied to the K signal lines 14 which belong to the wiring groups B[jeven], to the data lines 16[jeven] corresponding to the wiring groups B[jeven] via the second input unit 110b.

Control Circuit 500

The control circuit 500 controls the scanning line driving circuit 20, the first supply circuit 200a, and the second supply circuit 200b by using various signals including a synchronization signal. The control circuit 500 is an example of a control unit that controls the first supply circuit 200a and the second supply circuit 200b. Hereinafter, an example of the functions of the control circuit 500 will be described.

Figure 5:
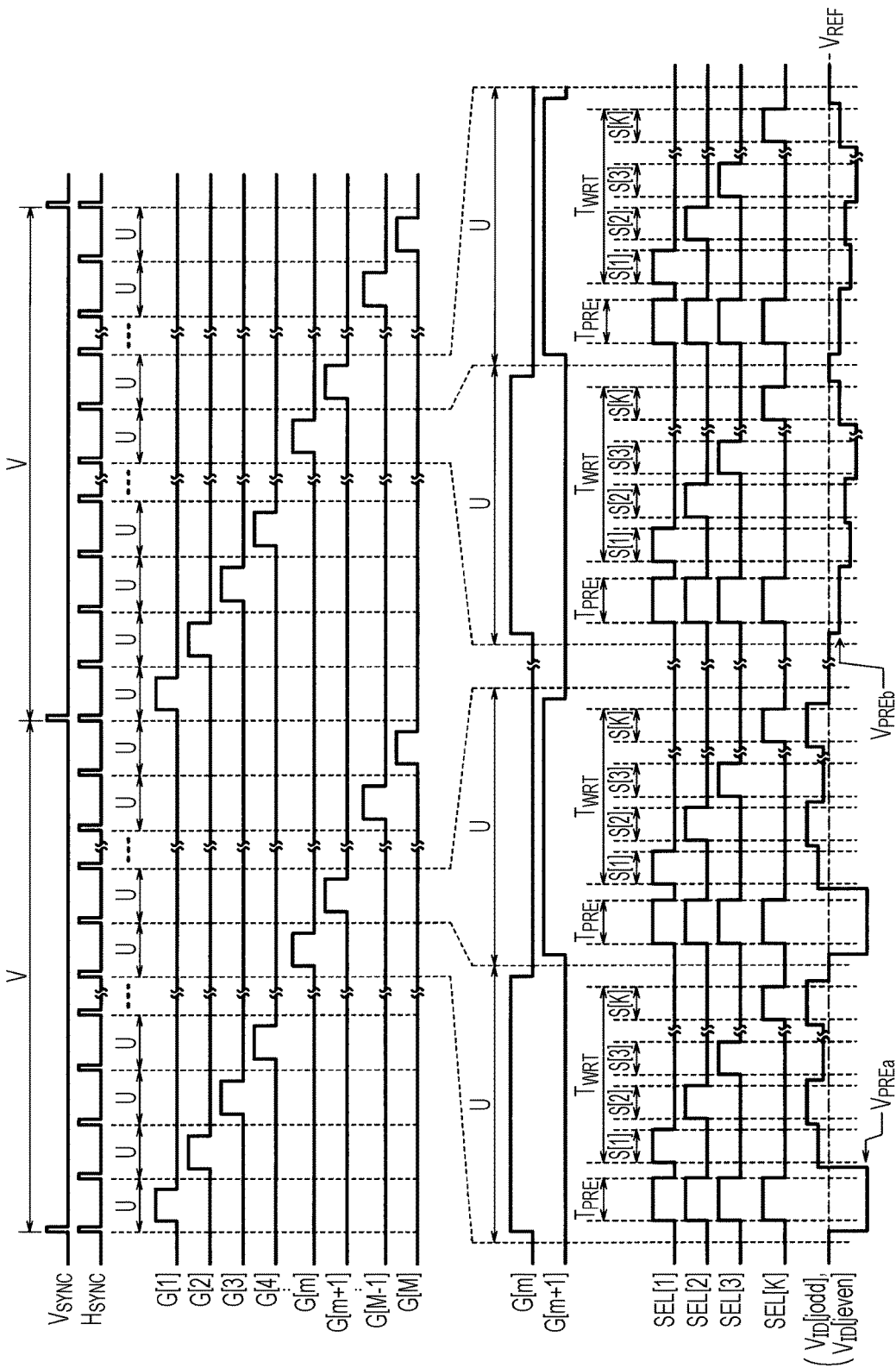
FIG. 5 is an explanatory diagram of an operation of the electrooptical device.

The control circuit 500 outputs a vertical synchronization signal $V_{SYNC}$ that defines a vertical scanning period V and a horizontal synchronization signal $H_{SYNC}$ that defines a horizontal scanning period, as illustrated in FIG. 5, to the scanning line driving circuit 20, the first supply circuit 200a, and the second supply circuit 200b.

The control circuit 500 outputs the digital data signals $D-V_{ID}[jodd]$ that designate, in a time-division manner, the gradation of the plurality of pixels (a plurality of first pixels) $P_{IX}$ provided corresponding to the respective intersections between the respective M scanning lines 12 and the respective signal lines 14 which belong to the odd-numbered wiring groups B[jodd], to the first supply circuit 200a. In addition, as illustrated in FIG. 5, the control circuit 500 outputs the digital data signals $D-V_{ID}[jodd]$ which are set such that the polarity of the data signals $V_{ID}[jodd]$ (voltages applied to the liquid crystal elements 42 illustrated in FIG. 4) is inverted for each vertical scanning period V, to the first supply circuit 200a. The first supply circuit 200a generates the data signals $V_{ID}[jodd]$ based on the digital data signals $D-V_{ID}[jodd]$.

Further, the control circuit 500 outputs an adjustment value A1 for adjusting the display of the plurality of first pixels, to the first supply circuit 200a.

The adjustment value A1 is used to prevent a variation between the luminance of the plurality of first pixels and the gradation (luminance) designated by the digital data signals $D-V_{ID}[jodd]$. For example, the adjustment value A1 is an adjustment value for adjusting the luminance of the plurality of first pixels to be high. The adjustment value A1 is changed for each timing at which the polarity of the voltage applied to the liquid crystal element 42 is inverted.

As described later, a phenomenon of the variation between the luminance of the plurality of first pixels and the gradation (luminance) designated by the digital data signals $D-V_{ID}[jodd]$ is caused, for example, by a variation in the power supply voltage of the first supply circuit 200a (a decrease in the power supply voltage) due to the use of selection signals SEL[1] to SEL[K] output from the first supply circuit 200a in the distribution circuits 21[1] to 21[J].

The adjustment value A1 is used to compensate for variation in the luminance of the plurality of first pixels due to the variation in the power supply voltage of the first supply circuit 200a. The adjustment value A1 is determined according to the individual characteristics of the electrooptical device 1.

For example, at the time of manufacturing the electrooptical device 1, when the control circuit 500 outputs the digital data signals $D-V_{ID}$ for instructing all the pixels $P_{IX}$ included in the pixel unit 10 to display the same gradation, differences in the luminance between the first pixels and other pixels are measured, and the adjustment value A1 is determined such that differences between the measured values decrease.

Here, the relationship between the digital data signals $D-V_{ID}[jodd]$ output from the control circuit 500 and the data signals $V_{ID}[jodd]$ output from the first supply circuit 200a will be described.

The digital data signals $D-V_{ID}[jodd]$ designate, in a time-division manner, the gradation of the plurality of first pixels $P_{IX}$.

The data signals $V_{ID}[jodd]$ include, in a time-division manner, the potential according to gradation (adjusted gradation) obtained by adjusting the gradation designated in a time-division manner by the digital data signals D-$V_{ID}$[jodd] using the adjustment value A1 output from the control circuit 500.

The data signals $V_{ID}$[jodd] output from the first supply circuit 200a are an example of first data signals.

The digital data signals D-$V_{ID}$[jodd] are an example of basic signals of the data signals $V_{ID}$[jodd] (first data signals).

The control circuit 500 outputs the digital data signals D-$V_{ID}$[jeven] that designate, in a time-division manner, the gradation of the plurality of pixels (a plurality of second pixels) $P_{IX}$ provided corresponding to the respective intersections between the respective M scanning lines 12 and the respective signal lines 14 which belong to the even-numbered wiring groups B[jeven], to the second supply circuit 200b. As illustrated in FIG. 5, the control circuit 500 outputs the digital data signals D-$V_{ID}$[jeven] which are set such that the polarity of the data signals $V_{ID}$[jeven] (voltages applied to the liquid crystal elements 42 illustrated in FIG. 4) is inverted for each vertical scanning period V, to the second supply circuit 200b. The second supply circuit 200b generates the data signals $V_{ID}$[jeven] based on the digital data signals D-$V_{ID}$[jeven].

Further, the control circuit 500 outputs an adjustment value A2 to the second supply circuit 200b. The adjustment value A2 is used to prevent a variation between the luminance of the plurality of second pixels and the gradation (luminance) designated by the digital data signals D-$V_{ID}$[jeven]. In this embodiment, the adjustment value A2 is zero, that is, "no adjustment".

Here, the relationship between the digital data signals D-$V_{ID}$[jeven] output from the control circuit 500 and the data signals $V_{ID}$[jeven] output from the second supply circuit 200b will be described.

The digital data signals D-$V_{ID}$[jeven] designate, in a time-division manner, the gradation of the plurality of second pixels $P_{IX}$.

The data signals $V_{ID}$[jeven] include, in a time-division manner, the potential according to gradation obtained by adjusting the gradation designated in a time-division manner by the digital data signals D-$V_{ID}$[jeven] using the adjustment value A2. In this embodiment, since the adjustment value A2 is zero, the data signals $V_{ID}$[jeven] include, in a time-division manner, the potential according to the gradation designated in a time-division manner by the digital data signals D-$V_{ID}$[jeven]. The data signals $V_{ID}$[jeven] output from the second supply circuit 200b are an example of second data signals.

As described above, even in the second supply circuit 200b, the adjustment using the adjustment value is performed similarly to the first supply circuit 200a, and thus the first supply circuit 200a and the second supply circuit 200b can have the same configuration. In a case where the first supply circuit 200a and the second supply circuit 200b have the same configuration, it is possible to reduce the types of components of the electrooptical device 1.

The first data signals and the second data signals are so-called data signals, and are analog signals having different waveforms according to the display of an image, for example.

Further, the control circuit 500 generates selection signals SEL[1] to SEL[K] of K systems that correspond to the number (K) of the signal lines 14 in each wiring group B[j] (j=1 to J). The control circuit 500 outputs the selection signals SEL[1] to SEL[K] to the first supply circuit 200a and the second supply circuit 200b.

The selection signals SEL[1] to SEL[K] are an example of selection signals. The selection signals are timing signals for controlling the distribution of the data signals $V_{ID}$[j] to the K signal lines 14 which belong to each wiring group B[j]. The selection signals control the distribution of the data signals $V_{ID}$[jodd] to the signal lines 14 which belong to the wiring groups B[jodd] and the distribution of the data signals $V_{ID}$[jeven] to the signal lines 14 which belong to the wiring groups B[jeven].

The control circuit 500 outputs a vertical synchronization signal $V_{SYNC}$, a horizontal synchronization signal $H_{SYNC}$, the digital data signals D-$V_{ID}$[jodd], and the selection signals SEL[1] to SEL[K], to the first supply circuit 200a, by using, for example, a low voltage differential signaling (LVDS) method. The control circuit 500 may output a vertical synchronization signal $V_{SYNC}$, a horizontal synchronization signal $H_{SYNC}$, the digital data signals D-$V_{ID}$[jodd], and the selection signals SEL[1] to SEL[K], to the first supply circuit 200a, by using a different method from LVDS.

Further, the control circuit 500 outputs a vertical synchronization signal $V_{SYNC}$, a horizontal synchronization signal $H_{SYNC}$, the digital data signals D-$V_{ID}$[jeven], and the selection signals SEL[1] to SEL[K], to the second supply circuit 200b, by using, for example, LVDS. The control circuit 500 may output a vertical synchronization signal $V_{SYNC}$, a horizontal synchronization signal $H_{SYNC}$, the digital data signals D-$V_{ID}$[jeven], and the selection signals SEL[1] to SEL[K], to the second supply circuit 200b, by using a different method from LVDS.

Scanning Line Driving Circuit 20

The scanning line driving circuit 20 is an example of a scanning line driving unit. As illustrated in FIG. 5, the scanning line driving circuit 20 sequentially selects the respective M scanning lines 12 according to the horizontal synchronization signal $H_{SYNC}$, by sequentially outputting the scanning signals G[1] to G[M] to the respective M scanning lines 12 for each unit period U. The unit period U is set to the time length of one cycle of the horizontal synchronization signal $H_{SYNC}$ (horizontal scanning period (1H)).

As illustrated in FIG. 5, the scanning line driving circuit 20 sets the scanning signal G[m] supplied to the scanning line 12 of the m-th row (m-th line) to the high level (potential indicating selection of the scanning line 12) in the m-th unit period U among the M unit periods U of each vertical scanning period V. The period for which the scanning line 12 is selected is also called a line period, and in this embodiment, substantially corresponds to the unit period U.

When the scanning line driving circuit 20 selects the scanning line 12 of the m-th row, the respective selection switches 44 of the N pixels $P_{IX}$ of the m-th row transition to the turned-on state.

As illustrated in FIG. 5, the unit period U includes a precharge period $T_{PRE}$ and a write period $T_{WRT}$.

The precharge period $T_{PRE}$ is provided before the start of the write period $T_{WRT}$. In FIG. 5, although one precharge period $T_{PRE}$ is provided before the write period $T_{WRT}$, a plurality (for example, two) of precharge periods $T_{PRE}$ may be provided before the write period $T_{WRT}$.

In the write period $T_{WRT}$, the data signal $V_{ID}$ (potential) is supplied to the respective signal line 14. In the precharge period $T_{PRE}$, predetermined precharge potential $V_{PRE}$ ($V_{PREa}$, $V_{PREb}$) is supplied to the respective signal line 14.

Distribution Circuit Group 21

Returning to FIG. 3, the distribution circuit group 21 includes J distribution circuits 21[1] to 21[J]. The distribution circuits 21[1] to 21[J] correspond to the wiring groups B[1] to B[J] one to one. For example, a demultiplexer is used as each of the distribution circuits 21 [1] to 21[J].

Figure 6:
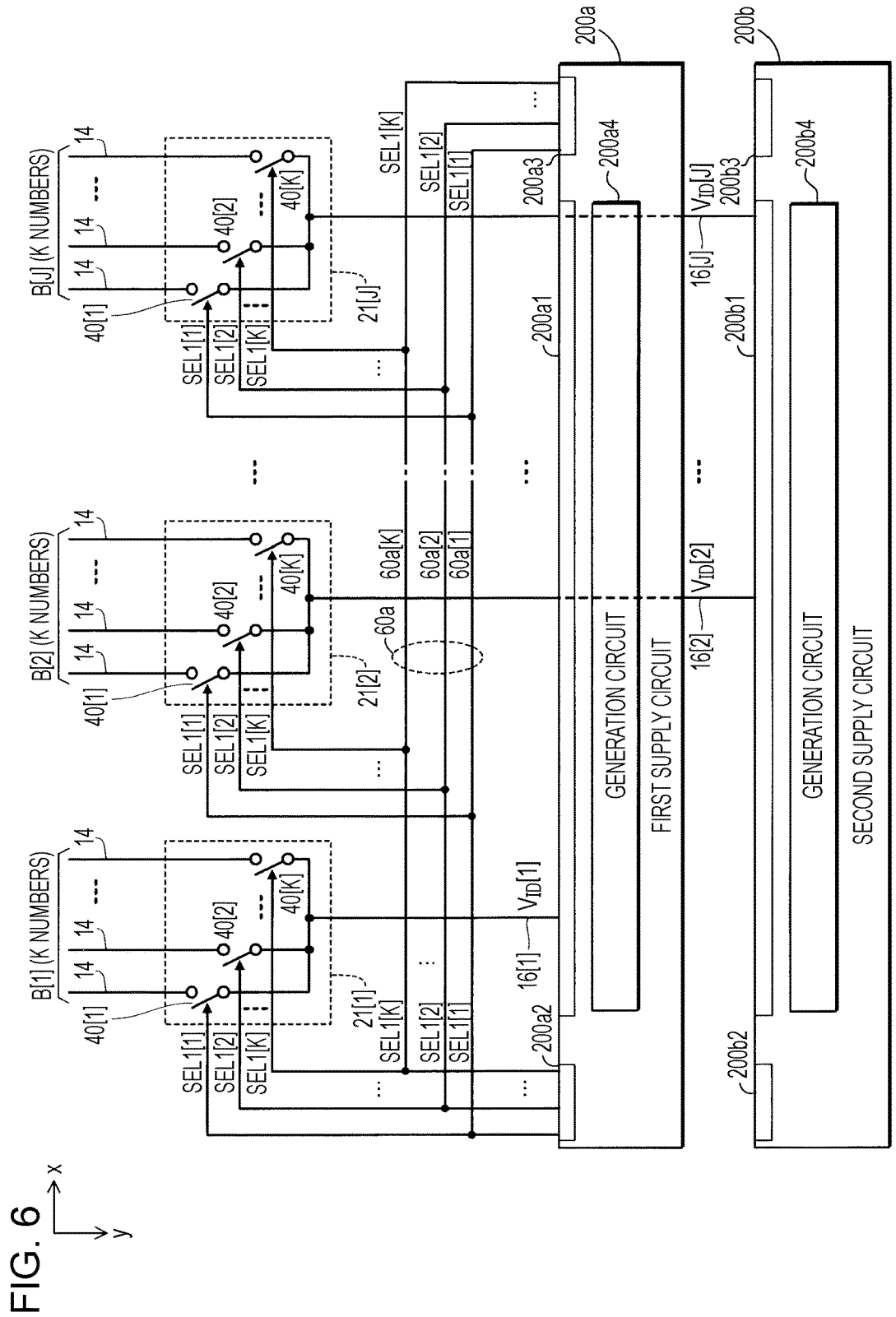
FIG. 6 is a diagram illustrating a configuration of a part of the electrooptical device.

FIG. 6 is a diagram illustrating an example of the distribution circuits 21[1] to 21[J], the first supply circuit 200a, and the second supply circuit 200b.

The j-th (j=1 to J) distribution circuit 21[j] is configured to include K switches 40[1] to 40[K] corresponding to the K signal lines 14 of the j-th wiring group B[j]. For example, a transistor is used as each of the switches 40[1] to 40[K].

The k-th (k=1 to K) switch 40[k] in the distribution circuit 21[j] is interposed between the signal line 14 of the k-th column among the K signal lines 14 of the wiring group B[j] and the j-th data line 16[j] among the J data lines 16[1] to 16[J], and controls the electrical connection (conduction/non-conduction) between the k-th signal line 14 and the j-th data line 16[j].

The odd-numbered distribution circuits 21[jodd] are connected to the first supply circuit 200a via the odd-numbered data lines 16[jodd] and the first input unit 110a. The first supply circuit 200a outputs the data signals $V_{ID}$[jodd] to the odd-numbered distribution circuits 21[jodd] via the first input unit 110a and the odd-numbered data lines 16[jodd]. The odd-numbered distribution circuits 21[jodd] connected to the first supply circuit 200a are an example of a first distribution unit.

The odd-numbered distribution circuits 21[jodd] are connected to the first supply circuit 200a via a first selection signal line group 60a including K first selection signal lines 60a[1] to 60a[K] and the first input unit 110a. The first supply circuit 200a outputs first selection signals SEL1[k] to the odd-numbered distribution circuits 21[jodd] via the k-th first selection signal lines 60a[k] in the first selection signal line group 60a. The first selection signals SEL1[1] to SEL1[K] are the selection signals SEL[1] to SEL[K] output from the first supply circuit 200a.

The odd-numbered distribution circuits 21[jodd] distribute the data signals $V_{ID}$[jodd] to the K signal lines 14 which belong to the wiring groups B[jodd] by using the first selection signals SEL1[1] to SEL1[K] output from the first supply circuit 200a.

The even-numbered distribution circuits 21[jeven] are connected to the second supply circuit 200b via the even-numbered data lines 16[jeven] and the second input unit 110b. The second supply circuit 200b outputs the data signals $V_{ID}$[jeven] to the even-numbered distribution circuits 21[jeven] via the second input unit 110b and the even-numbered data lines 16[jeven]. The even-numbered distribution circuits 21[jeven] which output the data signals $V_{ID}$[jeven] from the second supply circuit 200b are an example of a second distribution unit.

The even-numbered distribution circuits 21[jeven] are connected to the first supply circuit 200a via the first selection signal line group 60a. The first supply circuit 200a outputs first selection signals SEL1[k] to the even-numbered distribution circuits 21[jeven] via the k-th first selection signal lines 60a[k] in the first selection signal line group 60a.

The even-numbered distribution circuits 21[jeven] distribute the data signals $V_{ID}$[jeven] to the K signal lines 14 which belong to the wiring groups B[jeven] by using the first selection signals SEL1[1] to SEL1[K] output from the first supply circuit 200a.

The odd-numbered distribution circuits 21[jodd] and the even-numbered distribution circuits 21[jeven] are disposed adjacent to each other.

The first data signals (data signals $V_{ID}$[jodd]) output from the first supply circuit 200a are supplied to the odd-numbered distribution circuits 21[jodd] via the first input unit 110a and the odd-numbered data lines 16[jodd]. The second data signals (data signals $V_{ID}$[jeven]) output from the second supply circuit 200b are supplied to the even-numbered distribution circuits 21[jeven] via the second input unit 110b and the even-numbered data lines 16[jeven].

The data lines 16[jodd] and the data lines 16[jeven] are alternately disposed side by side. The first input unit 110a and the second input unit 110b are disposed side by side at an interval in the longitudinal direction (y direction) of the electrooptical panel 100.

In this case, the pitch between the data lines 16[jodd] and the data lines 16[jeven] can be smaller than the pitch between the data lines 16[jodd] and the pitch between the data lines 16[jeven]. In addition, it becomes easier to alternately dispose the pixel group (the plurality of first pixels) to which the first data signals are supplied and the pixel group (the plurality of second pixels) to which the second data signals are supplied. Thus, when the pixel groups are disposed in this way, it is possible to make a difference in image quality between the pixel groups inconspicuous. Further, it is possible to display a high-definition image without increasing the size of the electrooptical panel 100 in the transverse direction (x direction).

First Supply Circuit 200a

The first supply circuit 200a is an example of a first supply unit. The first supply circuit 200a includes a first output unit 200a1 for outputting the data signals $V_{ID}$[jodd] and a second output unit 200a2 and a third output unit 200a3 for outputting the first selection signals SEL1[1] to SEL1[K]. The first output unit 200a1 is provided between the second output unit 200a2 and the third output unit 200a3.

As illustrated in FIG. 3, the first supply circuit 200a receives, from the control circuit 500, the vertical synchronization signal $V_{SYNC}$, the horizontal synchronization signal $H_{SYNC}$, the digital data signals D-$V_{ID}$[jodd], the selection signals SEL[1] to SEL[K], and the adjustment value A1.

As illustrated in FIG. 6, the first supply circuit 200a includes a generation circuit 200a4. The generation circuit 200a4 generates the data signals $V_{ID}$[jodd] based on the digital data signals D-$V_{ID}$[jodd] and the adjustment value A1. The generation circuit 200a4 is an example of a first signal generation unit. The generation circuit 200a4 is incorporated in the first supply circuit 200a.

Figure 7:
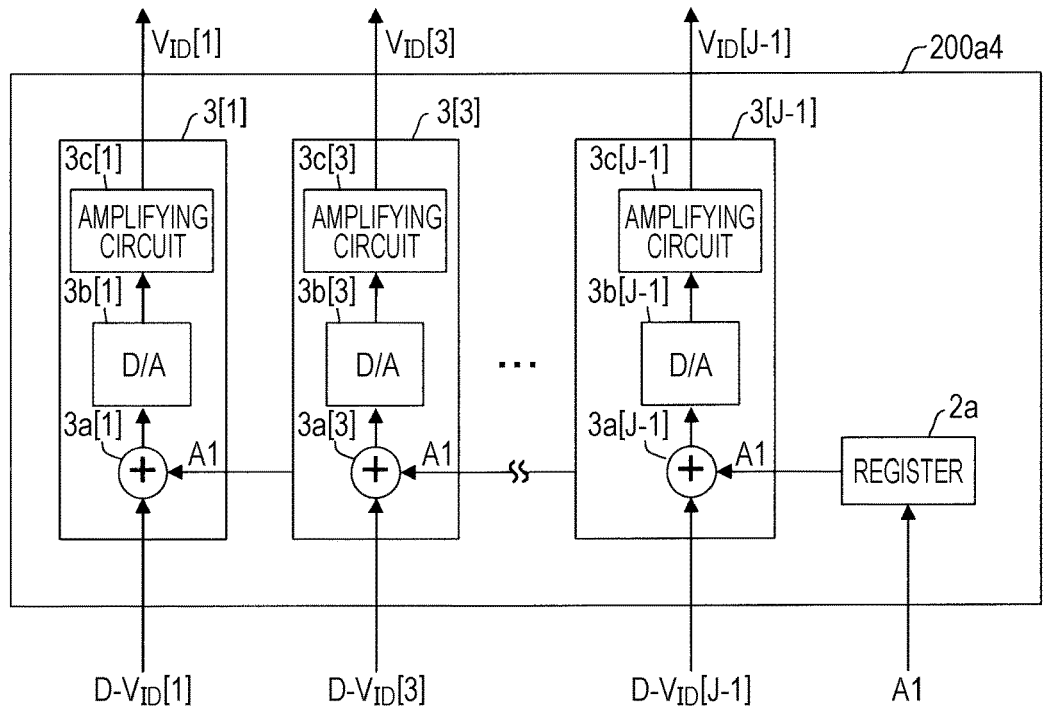
FIG. 7 is a diagram illustrating a generation circuit.

FIG. 7 is a diagram illustrating an example of the generation circuit 200a4.

The generation circuit 200a4 includes a register 2a and data signal generation circuits 3[jodd].

The register 2a holds the adjustment value A1.

The data signal generation circuits 3[jodd] include adders 3a[jodd], D/A conversion circuits 3b[jodd], and amplification circuits 3c[jodd], respectively.

The adders 3a[jodd] add the adjustment value A1 to the values of the digital data signals D-$V_{ID}$[jodd]. The adjustment value A1 is switched between a positive value and a negative value for each timing at which the polarity of the data signals $V_{ID}$[jodd] (voltages applied to the liquid crystal elements 42) is switched. Specifically, in a case where the polarity of the data signals $V_{ID}$[jodd] is positive, the adjustment value A1 is a positive value, and in a case where the polarity of the data signals $V_{ID}$[jodd] is negative, the adjustment value A1 is a negative value.

The adjustment value A1 is added, and thus the gradation (luminance) represented by the outputs of the adders 3a[jodd] is higher than the gradation (luminance) represented by the digital data signals D-$V_{ID}$[jodd].

The D/A conversion circuits 3b[jodd] output potential (analog value) according to the gradation (digital value) represented by the outputs of the adders 3a[jodd].

The amplification circuits 3c[jodd] generate the data signals $V_{ID}$[jodd] by amplifying the outputs of the D/A conversion circuits 3b[jodd]. The data signals $V_{ID}$[jodd] are an example of the signals generated based on the digital data signals D-$V_{ID}$[jodd] and the adjustment value A1.

Returning to FIG. 6, the first supply circuit 200a outputs the data signals $V_{ID}$[jodd] from the first output unit 200a1 to the data lines 16[jodd] at the timing according to the vertical synchronization signal $V_{SYNC}$ and the horizontal synchronization signal $H_{SYNC}$, and as illustrated in FIG. 6, outputs the first selection signals SEL1[1] to SEL1[K] from each of the second output unit 200a2 and the third output unit 200a3 to the first selection signal lines 60a[1] to 60a[K], respectively.

The distribution circuits 21[1] to 21[J] receive the first selection signals SEL1[1] to SEL1[K] from the first selection signal lines 60a[1] to 60a[K], and distribute the data signals $V_{ID}$ to the signal lines 14 by using the first selection signals SEL1[1] to SEL1[K].

Second Supply Circuit 200b

The second supply circuit 200b is an example of a second supply unit. The second supply circuit 200b includes a fourth output unit 200b1 for outputting the data signals $V_{ID}$[jeven] and a fifth output unit 200b2 and a sixth output unit 200b3 for outputting second selection signals SEL2[1] to SEL2[K]. The fourth output unit 200b1 is provided between the fifth output unit 200b2 and the sixth output unit 200b3. The second selection signals SEL2[1] to SEL2[K] are timing signals with the same timings as those of the first selection signals SEL1[1] to SEL1[K], respectively.

As illustrated in FIG. 3, the second supply circuit 200b receives, from the control circuit 500, the vertical synchronization signal $V_{SYNC}$, the horizontal synchronization signal $H_{SYNC}$, the digital data signals D-$V_{ID}$[jeven], the selection signals SEL[1] to SEL[K], and the adjustment value A2 indicating zero.

As illustrated in FIG. 6, the second supply circuit 200b includes a generation circuit 200b4. The generation circuit 200b4 generates the data signals $V_{ID}$[jeven] based on the digital data signals D-$V_{ID}$[jeven] and the adjustment value A2.

Figure 8:
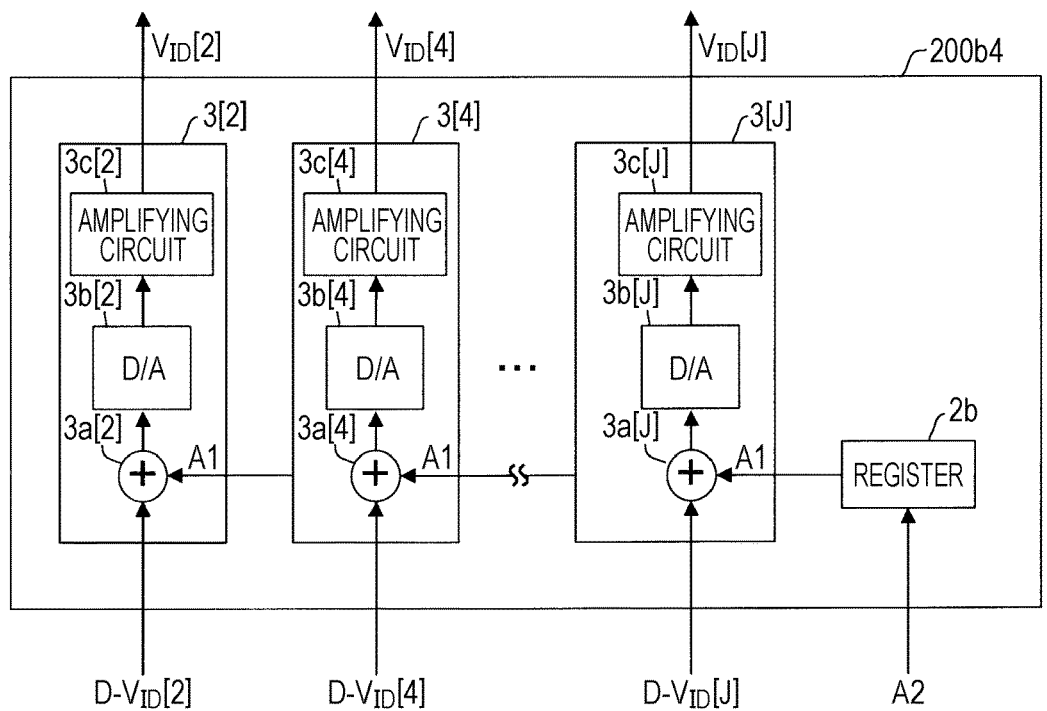
FIG. 8 is a diagram illustrating a generation circuit.

FIG. 8 is a diagram illustrating an example of the generation circuit 200b4.

The generation circuit 200b4 includes a register 2b and data signal generation circuits 3[jeven].

The register 2b holds the adjustment value A2. As described above, the adjustment value A2 indicates zero.

The data signal generation circuits 3[jeven] include adders 3a[jeven], D/A conversion circuits 3b[jeven], and amplification circuits 3c[jeven].

The adders 3a[jeven] add the adjustment value A2 to the values of the digital data signals D-$V_{ID}$[jeven].

Here, since the adjustment value A2 indicates zero, the outputs of the adders 3a[jeven] are the same as the values of the digital data signals D-$V_{ID}$[jeven].

Since the adders 3a[jeven] process the digital data signals D-$V_{ID}$[jeven] similarly to the adders 3a[jodd] which process the digital data signals D-$V_{ID}$[jodd], in the digital data signals D-$V_{ID}$[jeven], a delay amount similar to the delay amount generated by the adders 3a[jodd] which process the digital data signals D-$V_{ID}$[jodd] is generated.

The D/A conversion circuits 3b[jeven] output potential (analog value) according to the gradation (digital value) represented by the outputs of the adders 3a[jeven].

The amplification circuits 3c[jeven] generate the data signals $V_{ID}$[jeven] by amplifying the outputs of the D/A conversion circuits 3b[jeven].

Returning to FIG. 6, the second supply circuit 200b outputs the data signals $V_{ID}$[jeven] from the fourth output unit 200b1 to the data lines 16[jeven] at a timing according to the vertical synchronization signal $V_{SYNC}$ and the horizontal synchronization signal $H_{SYNC}$.

Further, the second supply circuit 200b outputs the second selection signals SEL2[1] to SEL2[K] from each of the fifth output unit 200b2 and the sixth output unit 200b3. The fifth output unit 200b2 and the sixth output unit 200b3 are opened.

In this embodiment, the first selection signals SEL1[1] to SEL1[K] and the second selection signals SEL2[1] to SEL2[K] are signals having the same waveform, and are pulse signals for turning on the switches 40[k] in the distribution circuits 21[j] for a predetermined time.

In this embodiment, as described above, the first supply circuit 200a outputs the first selection signals SEL1[k] and the data signals $V_{ID}$[jodd] which are adjusted based on the adjustment value A1, to the odd-numbered distribution circuits 21[jodd]. The odd-numbered distribution circuits 21[jodd] distribute the data signals $V_{ID}$[jodd] to the K signal lines 14 which belong to the wiring groups B[jodd] by using the first selection signals SEL1[k]. The second supply circuit 200b outputs the data signals $V_{ID}$[jeven] to the even-numbered distribution circuits 21[jeven]. The even-numbered distribution circuits 21[jeven] distribute the data signals $V_{ID}$[jeven] to the K signal lines 14 which belong to the wiring groups B[jeven] by using the first selection signals SEL1[k].

That is, the first supply circuit outputs the first data signals and the first selection signals to the first distribution circuits, and the first distribution circuits distribute the first data signals to the first signal lines by using the first selection signals. The second supply circuit outputs the second data signals to the second distribution circuits, and the second distribution circuits distribute the second data signals to the second signal lines by using the first selection signals. The first data signals are adjusted by the adjustment value.

Outline of Operation

Next, an outline of the operation of the electrooptical device 1 will be described.

The first supply circuit 200a outputs the first selection signals SEL1[1] to SEL1[K] from each of the second output unit 200a2 and the third output unit 200a3 to the distribution circuits 21[1] to 21[J] via the first selection signal lines 60a[1] to 60a[K].

At this time, the switches 40[1] to 40[K] in the wiring groups B[j] and the first selection signal lines 60a[1] to 60a[K] serve as loads of the first supply circuit 200a. In the first supply circuit 200a, because of the loads (the switches 40[1] to 40[K] in the wiring groups B[j] and the first selection signal lines 60a[1] to 60a[K]), the power supply voltage varies (decreases) due to the output of the first selection signals SEL1[1] to SEL1[K], and the signal levels (voltages or the like) of the data signals $V_{ID}$[jeven] vary (decrease) due to the variation in the power supply voltage.

Thus, in order to compensate the decrease amounts in the data signals $V_{ID}$[jeven] due to the variation in the power supply voltage, the data signal generation circuits 3[jodd] of the first supply circuit 200a add the adjustment value A1 to the digital data signals D-$V_{ID}$[jodd], and generate the data signals $V_{ID}$[jodd] (first data signals) according to the addition results. In addition, the first supply circuit 200a outputs the data signals $V_{ID}$[jodd] generated by the data signal generation circuits 3[jodd] from the first output unit 200a1 to the data lines 16[jodd].

On the other hand, the data signal generation circuits 3[jeven] of the second supply circuit 200b add the adjustment value A2 (adjustment value A2=0) to the digital data signals D-$V_{ID}$[jeven], and generate the data signals $V_{ID}$[jeven] (second data signals) according to the addition results. The second supply circuit 200b outputs the data signals $V_{ID}$[jeven] from the fourth output unit 200b1 to the data lines 16[jeven].

Further, the second supply circuit 200b outputs the second selection signals SEL2[1] to SEL2[K] from each of the fifth output unit 200b2 and the sixth output unit 200b3. At this time, since the fifth output unit 200b2 and the sixth output unit 200b3 are in an open state (opened), there is no load on the second selection signals SEL2[1] to SEL2[K] (specifically, the switches 40[1] to 40[K] in the wiring groups B[j] and first selection signal lines 60a[1] to 60a[K]).

Therefore, in the second supply circuit 200b, there is no variation in the power supply voltage due to the output of the second selection signals SEL2[1] to SEL2[K], and the decrease in the data signals $V_{ID}$[jeven] due to the variation in the power supply voltage does not occur.

As described above, in the second supply circuit 200b, the second selection signals SEL2[1] to SEL2[K] are not output to any of the switches 40[1] to 40[K] in the wiring groups B[j] and the first selection signal lines 60a[1] to 60a[K], and thus the decrease in the data signals $V_{ID}$[jeven] due to the output of the second selection signals SEL2[1] to SEL2[K] does not occur.

On the other hand, in the first supply circuit 200a, although the data signals $V_{ID}$[jodd] decrease due to the output of the first selection signals SEL1[1] to SEL1[K], the decrease amounts are compensated by using the adjustment value A1.

Therefore, variations between the data signals $V_{ID}$[jodd] and the data signals $V_{ID}$[jeven] can be reduced, and thus it is possible to prevent deterioration in image quality.

Detailed Description of Operation

1. Precharge Operation

First, a precharge operation will be described.

As illustrated in FIG. 5, in the precharge period $T_{PRE}$, the first supply circuit 200a sets the precharge potential $V_{PRE}$ (any one of $V_{PREa}$ and $V_{PREb}$) to the data signals $V_{ID}$[jodd], based on the adjustment value A1. The precharge potential $V_{PRE}$ is set to negative potential with respect to predetermined reference potential $V_{REF}$ (for example, potential corresponding to the center of the amplitude of the data signals $V_{ID}$).

As illustrated in FIG. 5, in the precharge period $T_{PRE}$ immediately before the write period $T_{WRT}$ for which the potential of the data signals $V_{ID}$[jodd] is set to positive potential with respect to the reference potential $V_{REF}$, the first supply circuit 200a sets the precharge potential $V_{PREa}$ to the data signals $V_{ID}$[jodd], based on the adjustment value A1.

In the precharge period $T_{PRE}$ immediately before the write period $T_{WRT}$ for which the potential of the data signals $V_{ID}$[jodd] is set to negative potential with respect to the reference potential $V_{REF}$, the first supply circuit 200a sets the precharge potential $V_{PREb}$ to the data signals $V_{ID}$[jodd], based on the adjustment value A1.

The precharge potential $V_{PREa}$ is lower than the precharge potential $V_{PREb}$. In other words, the difference between the precharge potential $V_{PREa}$ and the reference potential $V_{REF}$ is larger than the difference between the precharge potential $V_{PREb}$ and the reference potential $V_{REF}$.

During the precharge period $T_{PRE}$, the first supply circuit 200a simultaneously sets the first selection signals SEL1[1] to SEL1[K] to the active level (potential at which the switches 40[k] transition to the turned-on state) (refer to SEL[1] to SEL[K] in FIG. 5).

On the other hand, as illustrated in FIG. 5, in the precharge period $T_{PRE}$, the second supply circuit 200b sets the precharge potential $V_{PRE}$ (any one of $V_{PREa}$ and $V_{PREb}$) to the data signals $V_{ID}$[jeven].

In the precharge period $T_{PRE}$ immediately before the write period $T_{WRT}$ for which the potential of the data signals $V_{ID}$[jeven] is set to positive potential with respect to the reference potential $V_{REF}$, the second supply circuit 200b sets the precharge potential $V_{PREa}$ to the data signals $V_{ID}$[jeven].

In the precharge period $T_{PRE}$ immediately before the write period $T_{WART}$ for which the potential of the data signals $V_{ID}$[jeven] is set to negative potential with respect to the reference potential $V_{REF}$, the second supply circuit 200b sets the precharge potential $V_{PREb}$ to the data signals $V_{ID}$[jeven].

During the precharge period $T_{PRE}$, the second supply circuit 200b simultaneously sets the second selection signals SEL2[1] to SEL2[K] to the active level.

Even during the precharge period $T_{PRE}$, in the second supply circuit 200b, the second selection signals SEL2[1] to SEL2[K] are not output to any of the switches 40[1] to 40[K] in the wiring groups B[j] and the first selection signal lines 60a[1] to 60a[K], and thus the decrease in the data signals $V_{ID}$[jeven] due to the output of the second selection signals SEL2[1] to SEL2[K] does not occur.

On the other hand, in the first supply circuit 200a, although the data signals $V_{ID}$[jodd] decrease due to the output of the first selection signals SEL1[1] to SEL1[K], the decrease amounts are compensated by using the adjustment value A1.

Therefore, in the precharge period $T_{PRE}$, variations between the data signals $V_{ID}$[jodd] and the data signals $V_{ID}$[jeven] can be reduced, and variations in the precharge effect can be reduced. Thus, it is possible to prevent deterioration in image quality.

2. Write Operation

Next, a write operation will be described.

During the write period $T_{WRT}$ within the selection period of the scanning line 12 of the m-th row, the first supply circuit 200a sets, in a time-division manner, the potential of the data signals $V_{ID}$[jodd] to the potential according to the value obtained by adding the adjustment value A1 to the designated gradation of the pixels $P_{IX}$ corresponding to the respective intersections between the scanning line 12 of the m-th row and the signal lines 14 in the wiring groups B[jodd]. The designated gradation of each pixel $P_{IX}$ is defined by the digital data signals D-$V_{ID}$[jodd] supplied from the control circuit 500.

In order to prevent so-called ghosting, the first supply circuit 200a sequentially inverts the polarity of the potential of the data signals $V_{ID}$[jodd] with respect to the reference potential $V_{REF}$, based on the digital data signals D-$V_{ID}$[jodd], periodically (for example, for each vertical scanning period V).

Further, during the write period $T_{WRT}$, the first supply circuit 200a sets, in order, the first selection signals SEL1[1] to SEL1[K] to the active level in K selection periods S[1] to S[K] (refer to SEL[1] to SEL[K] illustrated in FIG. 5).

During the write period $T_{WRT}$ within the selection period of the scanning line 12 of the m-th row, the second supply circuit 200b sets, in a time-division manner, the potential of the data signals $V_{ID}$[jeven] to the potential according to the designated gradation of the pixels $P_{IX}$ corresponding to the respective intersections between the scanning line 12 of the m-th row and the signal lines 14 in the wiring groups B[jeven]. The designated gradation of each pixel $P_{IX}$ is defined by the digital data signals D-$V_{ID}$[jeven] supplied from the control circuit 500.

In addition, the second supply circuit 200b sequentially inverts the polarity of the potential of the data signals $V_{ID}$[jeven] with respect to the reference potential $V_{REF}$, periodically (for example, for each vertical scanning period V).

Further, during the write period $T_{WRT}$, the second supply circuit 200b sets, in order, the second selection signals SEL2[1] to SEL2[K] to the active level in K selection periods S[1] to S[K].

During a period for which the scanning line 12 of the m-th row is selected, in the selection periods S[k], the k-th switches 40[k] (total J switches 40[k]) among the K switches 40[1] to 40[K] in each of the distribution circuits 21[1] to 21[J] transition to the turned-on state by the first selection signals SEL1[k] output from the first supply circuit 200a. Accordingly, the potential of the data signals $V_{ID}$[j] is supplied to the signal lines 14 of the k-th columns of the respective wiring groups B[j].

That is, during the write period $T_{WRT}$ within each unit period U, in each of the J wiring groups B[1] to B[J], the potential of the data signals $V_{ID}$[j] is supplied to the K signal lines 14 in the wiring groups B[j] in a time-division manner. The potential according to the designated gradation is written in the pixels $P_{IX}$ corresponding to the respective intersections between the scanning line 12 of the m-th row and the signal lines 14 of the k-th columns in the wiring groups B[j].

Even during the write period $T_{WRT}$, in the first supply circuit 200a, although the data signals $V_{ID}$[jodd] decrease due to the output of the first selection signals SEL1[1] to SEL1[K], the decrease amounts are compensated by using the adjustment value A1. On the other hand, in the second supply circuit 200b, the second selection signals SEL2[1] to SEL2[K] are not output to any of the switches 40[1] to 40[K] in the wiring groups B[j] and the first selection signal lines 60a[1] to 60a[K], and thus the decrease in the data signals $V_{ID}$[jeven] due to the output of the second selection signals SEL2[1] to SEL2[K] does not occur.

Therefore, even during the write period $T_{WRT}$, variations between the data signals $V_{ID}$[jodd] and the data signals $V_{ID}$[jeven] can be reduced, and thus it is possible to prevent deterioration in image quality.

Figure 9:
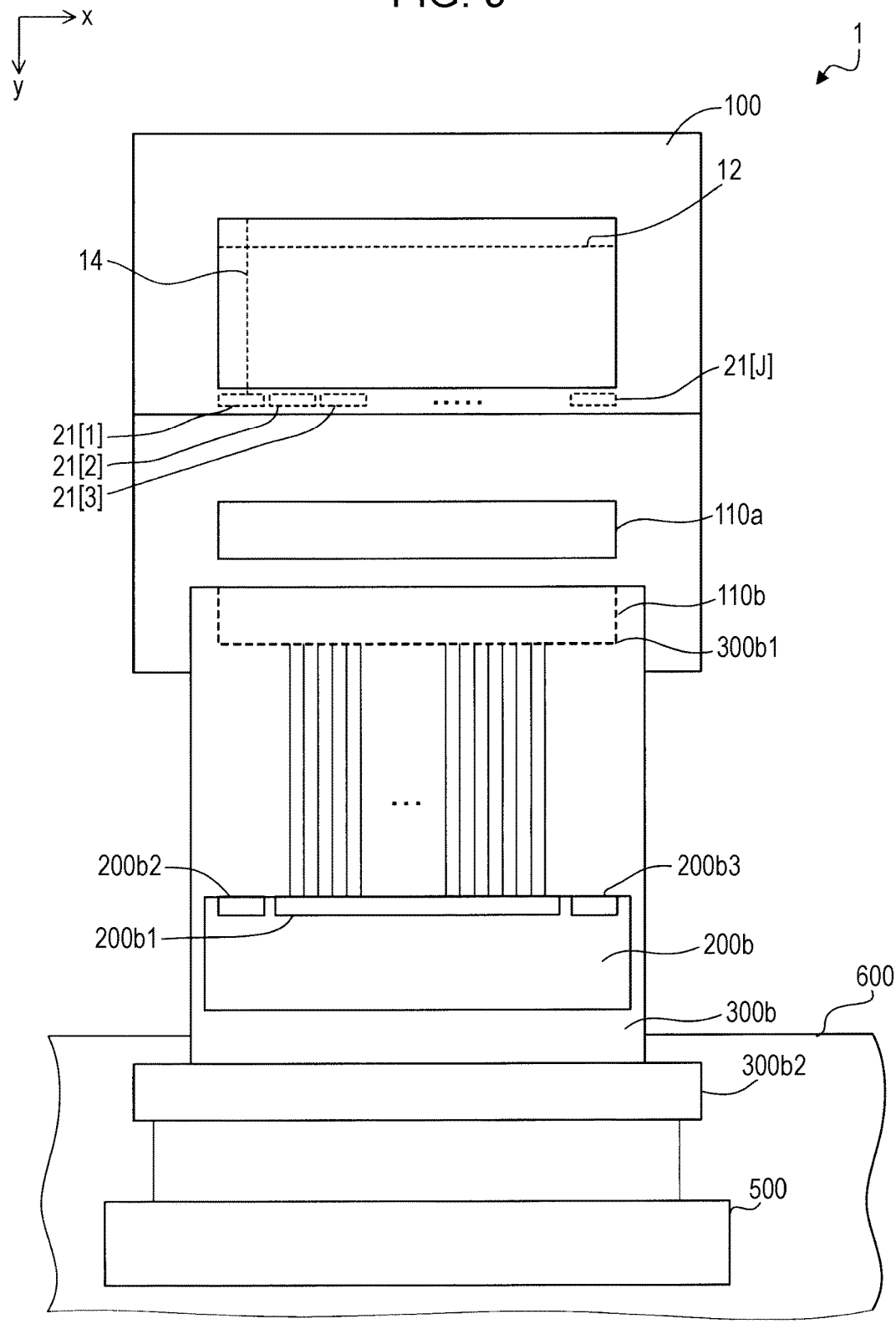
FIG. 9 is a plan view illustrating a configuration of the electrooptical device.

Arrangement Direction of Distribution Circuits 21[j] and Arrangement Direction of First Input Unit 110a and Second Input Unit 110b FIG. 9 is a diagram illustrating an example of the arrangement direction of the distribution circuits 21[1] to 21[J] and the arrangement direction of the first input unit 110a and the second input unit 110b. In FIG. 9, in order to simplify the description, the first supply circuit 200a and the flexible printed circuit board 300a are omitted from the electrooptical device 1.

The distribution circuits 21[1] to 21[J] are arranged in the row direction (x direction) in which the scanning lines 12 extend. The input terminals of the first input unit 110a and the input terminals of the second input unit 110b are arranged in the row direction, respectively. On the other hand, the first input unit 110a and the second input unit 110b are arranged along the column direction (y direction) in which the signal lines 14 extend.

Therefore, the size (width) in the x direction of the electrooptical device 1 can be reduced, compared to a case where the first input unit 110a and the second input unit 110b are arranged in the row direction (x direction). The row direction is the length direction of the scanning lines 12, and is orthogonal to the length direction of the signal lines 14 as the column direction.

The first input unit 110a receives the data signals $V_{ID}$[jodd] and the first selection signals SEL1[1] to SEL1[K] from the first supply circuit 200a. The second input unit 110b receives the data signals $V_{ID}$[jeven] from the second supply circuit 200b. The distribution circuits 21[jodd] receive the data signals $V_{ID}$[jodd] and the first selection signals SEL1[1] to SEL1[K] via the first input unit 110a. The distribution circuits 21[jeven] receive the first selection signals SEL1[1] to SEL1[K] via the first input unit 110a, and receive the data signals $V_{ID}$[jeven] via the second input unit 110b.

The control circuit 500 is provided in the control board 600. The second supply circuit 200b is connected to the control circuit 500 via a connector terminal 300b2 provided on the flexible printed circuit board 300b. Although not illustrated in FIG. 9, the first supply circuit 200a is connected to the control circuit 500 via a connector terminal (not illustrated) provided on the flexible printed circuit board 300a.

There is a resistance in the wiring (first selection signal lines 60a[1] to 60a[K]) for transmitting the first selection signals SEL1[1] to SEL1[K], and there is a capacitance between the wiring.

Thus, when the wiring for transmitting the first selection signals SEL1[1] to SEL1[K] becomes longer, the delay amounts of the first selection signals SEL1[1] to SEL1[K] become larger.

Therefore, according to the difference in the lengths of the wiring from the output sources of the first selection signals SEL1[1] to SEL1[K] to the respective distribution circuits 21[j], the delay amounts of the first selection signals SEL1[1] to SEL1[K] are different from each other. The difference in the delay amounts of the first selection signals SEL1[1] to SEL1[K] causes a variation in the write timings of the data signals $V_{ID}$, and this may cause deterioration in image quality.

In this embodiment, as illustrated in FIGS. 3 and 6, the second output unit 200a2 and the third output unit 200a3 that output the first selection signals SEL1[1] to SEL1[K] are provided at a position at which the first output unit 200a1 is interposed therebetween. Thus, the distribution circuits 21[j] can control the distribution operation using the first selection signals SEL1[1] to SEL1[K] output from a plurality of portions (the second output unit 200a2 and the third output unit 200a3).

Therefore, compared to the case where the first selection signals SEL1[1] to SEL1[K] are output from a single portion, the difference in the lengths of the wiring of the first selection signals SEL1[1] to SEL1[K] between the output sources of the first selection signals SEL1[1] to SEL1[K] and the respective distribution circuits 21[j] can be shortened. Thus, it is possible to reduce the difference in the delay amounts of the first selection signals SEL1[1] to SEL1[K]. Accordingly, it is possible to reduce disturbance in image quality due to the difference in the delay amounts of the first selection signals SEL1[1] to SEL1[K].

Further, since the positional relationship between the first output unit 200a1, the second output unit 200a2, and the third output unit 200a3 is the same as the positional relationship between the fourth output unit 200b1, the fifth output unit 200b2, and the sixth output unit 200b3, the configuration of the first supply circuit 200a and the configuration of the second supply circuit 200b can be the same. Therefore, it is possible to reduce the types of components of the electrooptical device 1.

In this embodiment, although the N signal lines 14 are divided into J wiring groups B[j] each with the K signal lines 14 as one unit that are continuously disposed in the transverse direction, the N signal lines 14 may be divided into J wiring groups B[j] each with the K signal lines 14 as one unit that are not continuously disposed in the transverse direction. For example, the signal lines 14 which belong to the wiring groups B[jodd] and the signal lines 14 which belong to the wiring groups B[jeven] may be alternately disposed. The odd-numbered signal lines 14 belong to the wiring groups B[jodd], and the even-numbered signal lines 14 belong to the wiring groups B[jeven]. Even in this case, it can be said that the wiring groups B[jodd] and the wiring groups B[jeven] are odd-numbered wiring groups and even-numbered wiring groups. The signals are supplied from the first supply circuit 200a and the second supply circuit 200b to the first pixels and the second pixels, respectively.

The first data signals and the first selection signals are signals supplied from the first supply circuit 200a, and the first signal lines are wiring to which the signals from the first supply circuit 200a are supplied. In addition, the second data signals and the second selection signals are signals supplied from the second supply circuit 200b, and the second signal lines are wiring to which the signals from the second supply circuit 200b are supplied. Further, the first distribution unit and the second distribution unit distribute the signals from the first supply circuit 200a and the second supply circuit 200b, respectively.

Second Embodiment

The electrooptical device 1A according to a second embodiment of the invention is different from the electrooptical device 1 according to the first embodiment in that the adders 3a[jodd] and the register 2a are removed from the first supply circuit 200a, in that the adders 3a[jeven] and the register 2b are removed from the second supply circuit 200b, and in that a generation circuit 500a including adders 3a[1] to 3a[J] and registers 2a and 2b is provided in the control circuit 500.

Figure 10:
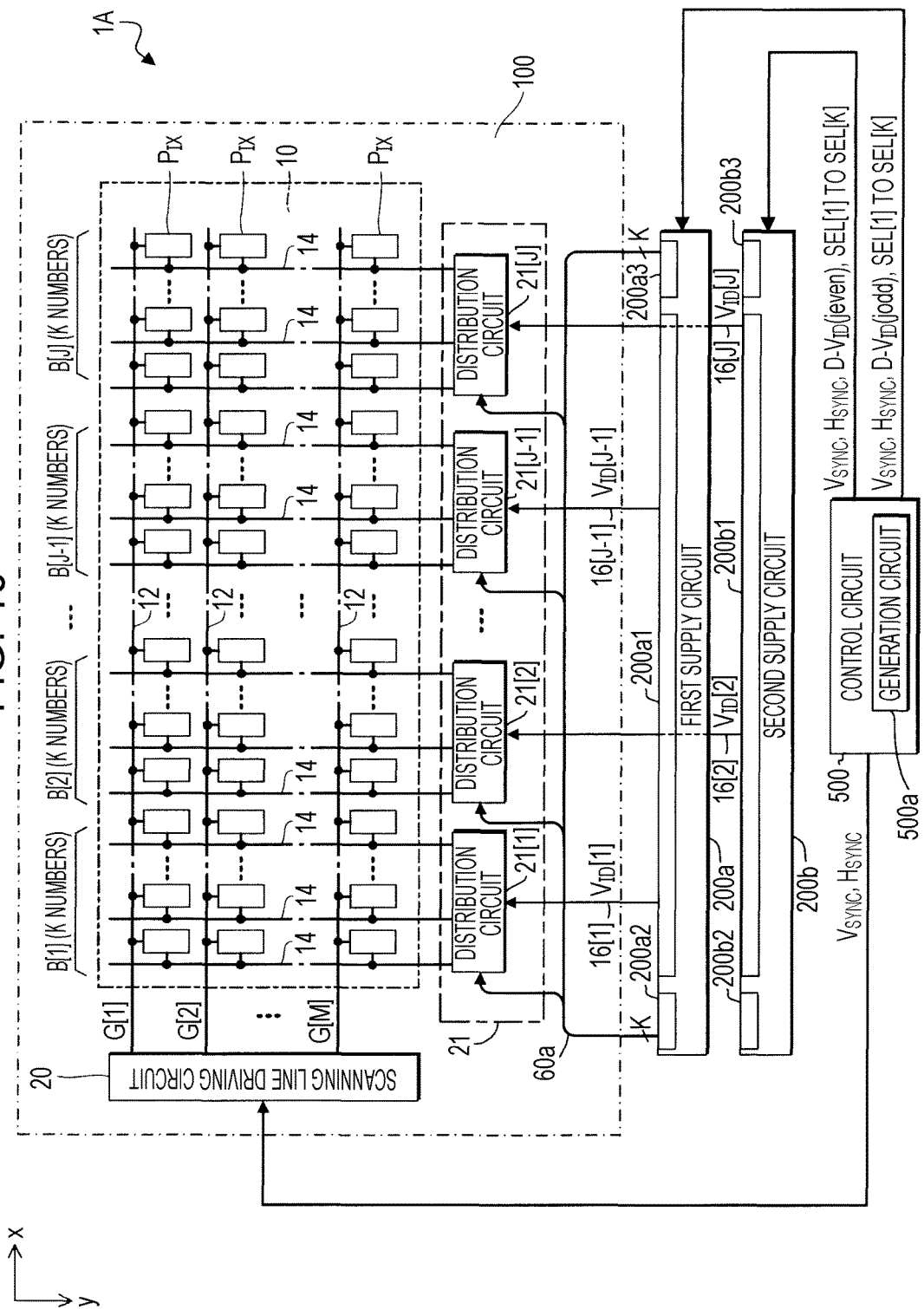
FIG. 10 is a block diagram illustrating the electrooptical device according to a second embodiment of the invention.

FIG. 10 is a diagram illustrating the electrooptical device 1A according to the second embodiment. In FIG. 10, portions having the same configuration as the configuration illustrated in FIG. 3 are denoted by the same reference numerals. Hereinafter, the electrooptical device 1A according to the second embodiment will be described focusing on the differences from the electrooptical device 1 according to the first embodiment.

The control circuit 500 of the electrooptical device 1A includes a generation circuit 500a. The generation circuit 500a generates adjusted digital data signals Da-V$_{ID}$[jodd] based on the digital data signals D-V$_{ID}$[jodd] and the adjustment value A1. The adjusted digital data signals Da-V$_{ID}$[jodd] are an example of third data signals. The generation circuit 500a is an example of a second signal generation unit.

Figure 11:
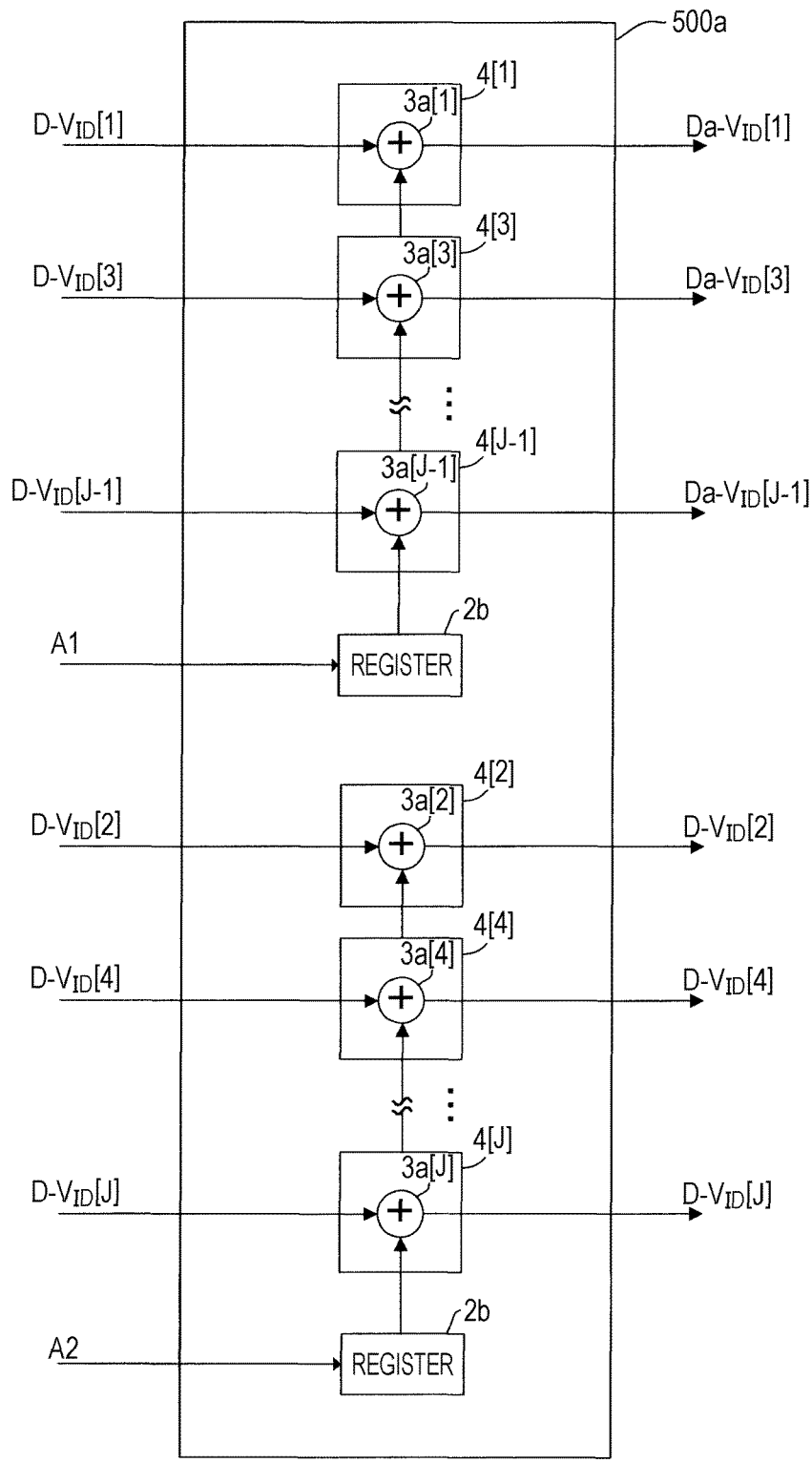
FIG. 11 is a diagram illustrating a generation circuit.

FIG. 11 is a diagram illustrating an example of the generation circuit 500a.

The generation circuit 500a includes digital data signal generation circuits 4[jodd], a register 2a, digital data signal generation circuits 4[jeven], and a register 2b.

The digital data signal generating circuits 4[jodd] include adders 3a[jodd]. The adders 3a[jodd] generate the adjusted digital data signals Da-V$_{ID}$[jodd] by adding the adjustment value A1 held in the register 2a to the digital data signals D-V$_{ID}$[jodd].

The digital data signal generating circuits 4[jeven] include adders 3a[jeven]. The adders 3a[jeven] output the digital data signals D-V$_{ID}$[jeven] by adding the adjustment value A2 (adjustment value A2 indicating zero) held in the register 2b to the digital data signals D-V$_{ID}$[jeven].

Returning to FIG. 10, the control circuit 500 outputs the adjusted digital data signals Da-V$_{ID}$[jodd] to the first supply circuit 200a, instead of the digital data signals D-V$_{ID}$[jodd].

The first supply circuit 200a generates the data signals V$_{ID}$[jodd] including, in a time-division manner, the potential according to the gradation designated by the adjusted digital data signals Da-V$_{ID}$[jodd], and outputs the data signals V$_{ID}$[jodd] to the distribution circuits 21[jodd].

In this embodiment, the control circuit 500 adjusts the digital data signals D-V$_{ID}$[jodd] using the adjustment value A1. Therefore, compared to the case where the first supply circuit 200a adjusts the digital data signals D-V$_{ID}$[jodd], it is possible to reduce the load of the first supply circuit 200a.

MODIFICATION EXAMPLE

The above embodiments can be modified in a variety of other forms. Specific modification forms are exemplified below. Two or more forms arbitrarily selected from the following examples can be appropriately combined unless the forms are inconsistent with each other.

Modification Example 1

The second supply circuit 200b may stop the output of the second selection signals SEL2[1] to SEL2[K]. For example, the second supply circuit 200b stops the output of the second selection signals SEL2[1] to SEL2[K] according to a stop instruction from the control circuit 500. In this case, the second supply circuit 200b may be connected to the odd-numbered distribution circuits 21[jodd] and the even-numbered distribution circuits 21[jeven] via a second selection signal line group (not illustrated).

Modification Example 2

Another adjustment value (for example, an adjustment value according to the positions of the pixels in the pixel unit 10) is added to the adjustment value A1, and the addition result may be used instead of the adjustment value A1.

Here, an example of the adjustment value according to the positions of the pixels in the pixel unit 10 will be described.

Even when the same data signals V$_{ID}$ are supplied to the plurality of pixels P$_{IX}$ in the pixel unit 10, the luminance of the plurality of pixels tends to decrease as the pixels are closer to the end of the pixel unit 10. Thus, there is a case where a configuration in which adjustment potential is added to the data signals V$_{ID}$ is adopted, and where the adjustment potential is adjusted to be high as the positions of the pixels P$_{IX}$ to which the adjustment potential is supplied are closer to the end of the pixel unit 10. The adjustment potential is an example of the adjustment value according to the positions of the pixels in the pixel unit 10.

Modification Example 3

An adjustment using an adjustment value may be performed in each of the first supply circuit 200a and the control circuit 500.

For example, an adjustment value A1*a* and an adjustment value A1*b* that satisfy the relationship "adjustment value A1*a*+adjustment value A1*b*=adjustment value A1" are generated. The control circuit 500 generates the adjusted digital data signals Da-$V_{ID}$[jodd] by correcting the digital data signals D-$V_{ID}$[jodd] using the adjustment value A1*a*. The first supply circuit 200*a* generates the data signals $V_{ID}$[jodd] by correcting the adjusted digital data signals Da-$V_{ID}$[jodd] using the adjustment value A1*b*.

Modification Example 4

In the above-described embodiments, as illustrated in FIGS. 1 and 2, a configuration in which the flexible printed circuit board 300*a* and the flexible printed circuit board 300*b* are attached so as to overlap each other when viewed from the display direction (z direction) of the electrooptical panel 100 is described. However, the invention is not limited to such a configuration. For example, the connection terminal 300*a*1 for connecting the flexible printed circuit board 300*a* and the connection terminal 300*b*1 for connecting the flexible printed circuit board 300*b* may be disposed on the electrooptical panel 100 side by side in the transverse direction (x direction) of the electrooptical panel 100. In this case, it is easy to mount the flexible printed circuit board 300*a* and the flexible printed circuit board 300*b* on the electrooptical panel 100. However, in this example, compared to the configuration in which the connection terminal 300*a*1 and the connection terminal 300*b*1 illustrated in FIGS. 1 and 2 are disposed in the longitudinal direction (y direction), there is a case where mounting regions of the flexible printed circuit board 300*a* and the flexible printed circuit board 300*b* become larger with respect to the pixel unit 10, or a case where the wiring connecting the pixel unit 10 and the mounting regions becomes longer.

Modification Example 5

The first supply circuit 200*a* may drive the distribution circuits 21[1] to 21[J/2], and the second supply circuit 200*b* may drive the distribution circuits 21[(J/2)+1] to 21[J]. In this case, since the distribution circuits 21[1] to 21[J/2] and the distribution circuits 21[(J/2)+1] to 21[J] can be easily divided in terms of position, it is possible to simplify the wiring between the distribution circuits 21[1] to 21[J] and the first supply circuit 200*a* and between the distribution circuits 21[1] to 21[J] and the second supply circuit 200*b*.

Modification Example 6

Although a liquid crystal device is used as the electrooptical device, the electrooptical device may be any device including an electrooptical material of which the optical properties change by electrical energy. As the electrooptical material, a liquid crystal, an organic electro-luminescence (EL) material, or the like may be used.

Modification Example 7

The adjustment value A1 may be zero, and the adjustment value A2 may not be zero.

The first supply circuit 200*a* outputs the data signals $V_{ID}$[jodd] and the first selection signals SEL1[1] to SEL1[K] to the odd-numbered distribution circuits 21[jodd]. The odd-numbered distribution circuits 21[jodd] distribute the data signals $V_{ID}$[jodd] to the K signal lines 14 which belong to the wiring groups B[jodd] by using the first selection signals SEL1[k]. The second supply circuit 200*b* outputs the data signals $V_{ID}$[jeven] adjusted based on the adjustment value A2 to the even-numbered distribution circuits 21[jeven]. In this case, the variation in the data signals $V_{ID}$[jodd] from the first supply circuit 200*a* is compensated by adjusting the data signals $V_{ID}$[jeven] from the second supply circuit 200*b*. The decrease amounts in the data signals $V_{ID}$[jodd] due to the output of the first selection signals SEL1[1] to SEL1[K] are compensated by subtracting the adjustment value A2 corresponding to the data signals $V_{ID}$[jeven].

That is, the first supply circuit outputs the first data signals and the first selection signals to the first distribution circuits, and the first distribution circuits distribute the first data signals to the first signal lines by using the first selection signals. The second supply circuit outputs the second data signals to the second distribution circuits, and the second distribution circuits distribute the second data signals to the second signal lines by using the first selection signals. The second data signals are adjusted by the adjustment value.

Even in this case, variations between the data signals $V_{ID}$[jodd] and the data signals $V_{ID}$[jeven] can be reduced, and thus it is possible to prevent deterioration in image quality. In addition, in the case of the adjustment using the adjustment value A2, power consumption can be suppressed. However, since the adjustment of increasing the voltage level or the like is more stable, the adjustment using the adjustment value A1 is more effective for preventing deterioration in image quality.

Modification Example 8

The number of the wiring boards connected to the electrooptical panel 100 is not limited to two. Three or more wiring boards may be connected to the electrooptical panel 100. For example, even in the case where three or more wiring boards are used, the supply circuit of at least one wiring board may output the selection signals, and the variation in the data signals due to the output of the selection signals may be adjusted.

Application Example

Figure 12:
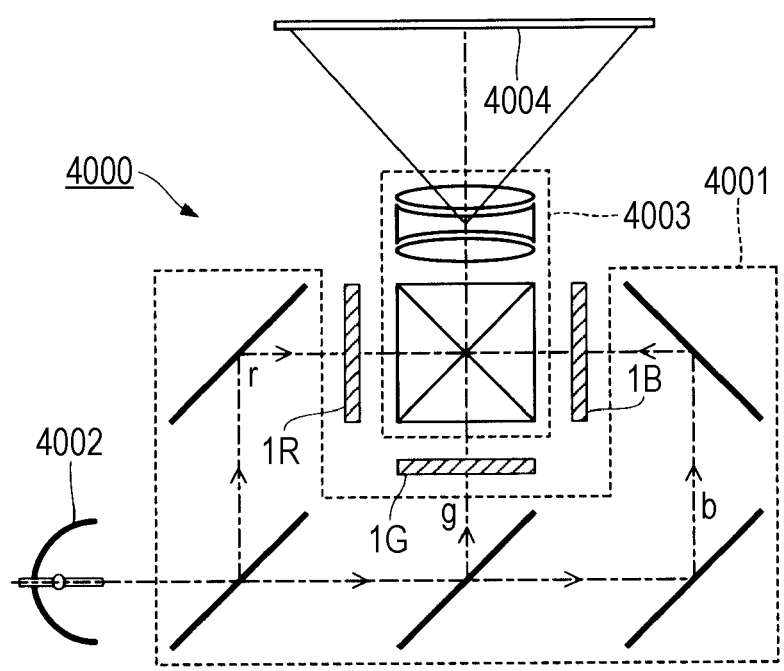
FIG. 12 is a perspective view illustrating a form of an electronic apparatus (a projection type display apparatus).

The electrooptical device exemplified in each of the above embodiments and modification examples can be used for various electronic apparatuses. FIG. 12 illustrates a specific form of an electronic apparatus in which the above-described electrooptical device is adopted.

FIG. 12 is a schematic diagram of a projection type display apparatus (three plate type projector) 4000 to which the above-described electrooptical device is applied. The projection type display apparatus 4000 is configured to include three electrooptical devices 1 (1R, 1G, and 1B) corresponding to different display colors (red, green, and blue). An illumination optical system 4001 supplies red components r among light emitted from an illumination device (light source) 4002 to the electrooptical device 1R, supplies green components g to the electrooptical device 1G, and supplies blue components b to the electrooptical device 1B. Each of the electrooptical devices 1 functions as an optical modulator (light valve) that modulates monochromatic light supplied from the illumination optical system 4001 according to the display image. A projection optical system 4003 combines the light emitted from the respective electrooptical devices 1 and projects the combined light on a projection surface 4004. The above-described electrooptical device 1 is applied, and thus it is possible to easily realize a compact projection type display apparatus 4000 capable of high-definition display.

The electronic apparatuses to which the electrooptical device according to the invention is applied include a portable personal computer, a personal digital assistants (PDA), a digital still camera, a television, a video camera, and a car navigation device, in addition to the apparatus illustrated in FIG. 12. Further, the electronic apparatuses include an in-vehicle display apparatus (instrument panel), an electronic organizer, an electronic paper, a calculator, a word processor, a workstation, a video phone, a POS terminal, a printer, a scanner, a copier, a video player, an apparatus including a touch panel, and the like.

The entire disclosure of Japanese Patent Application No. 2016-146170, filed Jul. 26, 2016 is expressly incorporated by reference herein.

What is claimed is:

1. An electrooptical device comprising:
   a plurality of first pixels that are disposed corresponding to the respective intersections between a plurality of first signal lines which belong to a first signal line group and a plurality of scanning lines, and that display a first gradation according to first data signals supplied to the first signal lines when the scanning lines are selected;
   a plurality of second pixels that are disposed corresponding to the respective intersections between a plurality of second signal lines which belong to a second signal line group and the plurality of scanning lines, and that display a second gradation according to second data signals supplied to the second signal lines when the scanning lines are selected;
   a first distribution unit that distributes the first data signals to the first signal lines using first selection signals;
   a second distribution unit that distributes the second data signals to the second signal lines using the first selection signals;
   a first supply unit that supplies the first data signals and the first selection signals; and
   a second supply unit that supplies the second data signals, wherein:
      the first data signals or the second data signals are adjusted based on an adjustment value for adjusting display of the first pixels or the second pixels, and
      the first supply unit includes a first output portion that connects to the first selection signals and the second supply unit includes a second output portion that is open.

2. An electrooptical device comprising:
   a plurality of scanning lines;
   a plurality of first signal lines;
   a plurality of second signal lines;
   a plurality of first pixels that are disposed corresponding to the respective intersections between the plurality of scanning lines and the plurality of first signal lines, and that perform display according to first data signals supplied to the first signal lines when the scanning lines are selected;
   a plurality of second pixels that are disposed corresponding to the respective intersections between the plurality of scanning lines and the plurality of second signal lines, and that perform display according to second data signals supplied to the second signal lines when the scanning lines are selected;
   a scanning line driving unit that sequentially selects each of the plurality of scanning lines;
   a first supply unit that outputs the first data signals and selection signals for controlling distribution of the first data signals to the plurality of first signal lines and distribution of the second data signals to the plurality of second signal lines;
   a second supply unit that outputs the selection signals and the second data signals;
   a first distribution unit that distributes the first data signals to the plurality of first signal lines using the selection signals output from the first supply unit; and
   a second distribution unit that distributes the second data signals to the plurality of second signal lines using the selection signals output from the first supply unit,
   wherein the first supply unit outputs, as the first data signals, signals generated based on basic signals of the first data signals and an adjustment value for adjusting the display of the plurality of first pixels, to the first distribution unit.

3. The electrooptical device according to claim 2, further comprising:
   a first signal generation unit that generates the first data signals based on the basic signals of the first data signals and the adjustment value,
   wherein the first supply unit outputs the first data signals generated by the first signal generation unit to the first distribution unit.

4. The electrooptical device according to claim 3,
   wherein the first signal generation unit is incorporated in the first supply unit.

5. The electrooptical device according to claim 2, further comprising:
   a second signal generation unit that generates third data signals based on the basic signals of the first data signals and the adjustment value,
   wherein the first supply unit generates the first data signals based on the third data signals generated by the second signal generation unit, and outputs the first data signals to the first distribution unit.

6. The electrooptical device according to claim 2,
   wherein the adjustment value is an adjustment value for adjusting the luminance of the plurality of first pixels to be high.

7. The electrooptical device according to claim 2,
   wherein the first distribution unit and the second distribution unit are disposed adjacent to each other.

8. The electrooptical device according to claim 2,
   wherein the plurality of scanning lines, the plurality of first signal lines, the plurality of second signal lines, the plurality of first pixels, the plurality of second pixels, the scanning line driving unit, the first distribution unit, and the second distribution unit are provided in an electrooptical panel,
   wherein the electrooptical panel includes
      a first input unit that receives the first data signals and the selection signals from the first supply unit, and
      a second input unit that receives the second data signals from the second supply unit,
   wherein the first distribution unit receives the first data signals and the selection signals via the first input unit,
   wherein the second distribution unit receives the selection signals via the first input unit and receives the second data signals via the second input unit, and
   wherein the first input unit and the second input unit are disposed side by side in the length direction of the first signal lines.

9. The electrooptical device according to claim 2,
   wherein the second supply unit stops the output of the selection signals.

10. An electronic apparatus comprising:
the electrooptical device according to claim 1.
11. An electronic apparatus comprising:
the electrooptical device according to claim 2.
12. An electronic apparatus comprising:
the electrooptical device according to claim 3.
13. An electronic apparatus comprising:
the electrooptical device according to claim 4.
14. An electronic apparatus comprising:
the electrooptical device according to claim 5.
15. An electronic apparatus comprising:
the electrooptical device according to claim 6.
16. An electronic apparatus comprising:
the electrooptical device according to claim 7.
17. An electronic apparatus comprising:
the electrooptical device according to claim 8.
18. An electronic apparatus comprising:
the electrooptical device according to claim 9.
19. A method for driving an electrooptical device, comprising:
   supplying first data signals and first selection signals by a first supply unit;
   supplying second data signals by a second supply unit;
   distributing the first data signals to first signal lines using the first selection signals, by a first distribution unit;
   distributing the second data signals to second signal lines using the first selection signals, by a second distribution unit;
   displaying a first gradation according to first data signals supplied to the first signal lines when the scanning lines are selected, by first pixels that are disposed corresponding to the respective intersections between the first signal lines and scanning lines;
   displaying a second gradation according to the second data signals supplied to the second signal lines when the scanning lines are selected, by second pixels that are disposed corresponding to the respective intersections between the second signal lines and the scanning lines; and
   adjusting the first data signals or the second data signals based on an adjustment value for adjusting display of the first pixels or the second pixels,
   wherein the first supply unit includes a first output portion that connects to the first selection signals and the second supply unit includes a second output portion that is open.

* * * * *